(12) United States Patent
Uher et al.

(10) Patent No.: US 6,413,113 B2
(45) Date of Patent: *Jul. 2, 2002

(54) KINEMATIC COUPLING

(75) Inventors: Frank Otto Uher, Los Altos; John William Andberg, Santa Cruz; Mark Charles Carbone, Mountain View; Donald Paul Richmond, II, Palo Alto, all of CA (US)

(73) Assignee: Aehr Test Systems, Mountain View, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/353,123

(22) Filed: Jul. 14, 1999

(51) Int. Cl.$^7$ ............................................. H01R 13/62
(52) U.S. Cl. ........................................................ 439/372
(58) Field of Search .................................. 439/310, 372, 439/953, 131, 139; 403/322, 325, 328; 414/730, 735, 739; 294/106; 324/758, 755; 169/504, 468

(56) References Cited

U.S. PATENT DOCUMENTS

| | | | |
|---|---|---|---|
| 4,374,317 A | 2/1983 | Bradshaw | ............... 219/385 |
| 5,174,772 A | * 12/1992 | Vranish | ................. 439/131 |
| 5,429,510 A | 7/1995 | Barraclough et al. | ......... 439/59 |
| 5,510,724 A | 4/1996 | Itoyama et al. | ............. 324/760 |
| 5,568,054 A | 10/1996 | Iino et al. | ................... 324/760 |
| 5,593,903 A | 1/1997 | Beckenbaugh et al. | ......... 437/8 |
| 5,597,737 A | 1/1997 | Greer et al. | ................... 437/8 |
| 5,614,837 A | 3/1997 | Itoyama et al. | ............. 324/760 |
| 5,682,472 A | 10/1997 | Brehm et al. | .......... 395/183.01 |
| 5,743,324 A | * 4/1998 | Kunstreich et al. | ......... 164/504 |
| 5,859,539 A | 1/1999 | Wood et al. | ................. 324/758 |
| 5,905,382 A | 5/1999 | Wood et al. | ................. 324/758 |

FOREIGN PATENT DOCUMENTS

| | | |
|---|---|---|
| JP | 08204137 | 8/1996 |
| JP | 08222693 | 8/1996 |
| JP | 09017832 | 1/1997 |
| JP | 10189672 | 7/1998 |
| JP | 10189673 | 7/1998 |
| JP | 10199943 | 7/1998 |
| JP | 10199944 | 7/1998 |

OTHER PUBLICATIONS

Five (5) sheets of website information from Panasonic website—downloaded Mar. 2, 1999.
1998 Annual Report of AEHR Test Systems.

* cited by examiner

Primary Examiner—Gary F. Paumen
Assistant Examiner—Alexander Gilman
(74) Attorney, Agent, or Firm—David J. Weitz; Wilson Sonsini Goodrich & Rosati

(57) ABSTRACT

A kinematic coupling includes a male connector (94) and first and second opposed jaws (122, 124.) Each of the jaws is pivotable from a retracted position in which the male connector can be inserted between the jaws and an engaging position in which the jaws prevent withdrawal of the male connector from between the jaws. The male connector is movable between an extended and a retracted position, and is biased towards the retracted position. This provides a positive clamping force when the kinematic coupling is engaged.

29 Claims, 19 Drawing Sheets

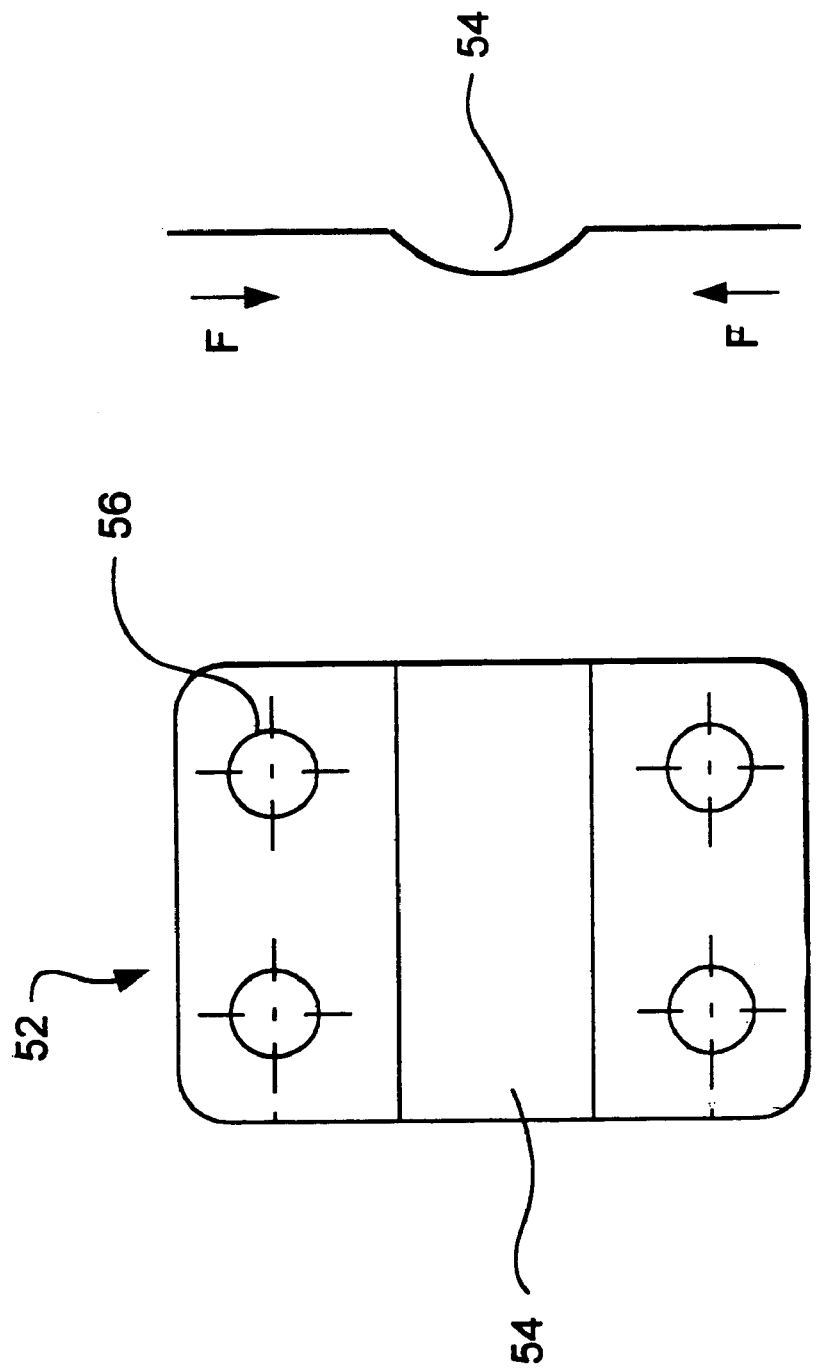

KINEMATIC COUPLING

This invention was supported in part by grants from the Defense Advanced Research Projects Agency. The U.S. Government may have rights in this invention.

INTRODUCTION

TECHNICAL FIELD

This invention particularly relates to a cartridge for use in the burn-in and/or test of circuitry formed on semiconductor wafers, before the wafer is diced. The invention may however also be applicable to the burn-in or test of other electrical devices. This invention further relates to methods of loading and aligning a probe card in the cartridge with a semiconductor wafer located in the cartridge. The invention also relates to a connecting device for use in the cartridge. This invention is related to the inventions in commonly owned U.S. Pat. No. 5,429,510, issued to Barraclough et al. on Jul. 5, 1995, entitled "High-Density Interconnect Technique," and commonly owned U.S. Pat. No. 5,682,472, issued to Brehm et al. on Oct. 28, 1997 and entitled "Method and System for Testing Memory Programming Devices," the disclosures of which are hereby incorporated by reference herein. This invention is flirther related to the invention in a concurrently filed, copending, commonly owned application entitled "Wafer Level Burn-In and Electrical Test System and Method" (Attorney Docket No. AEHR-007/00US,) the disclosure of which is also incorporated by reference herein.

BACKGROUND OF THE INVENTION

It is well known that integrated circuits (IC's), if they are going to fail, tend to fail early in their projected lives. To identify and eliminate such fragile IC's, IC manufacturers typically expose their integrated circuits to conditions that tend to induce such premature failure. This is known as burn-in, and the typical conditions to which the integrated circuits are exposed during burn-in are elevated temperatures together with the simultaneous application of electrical signals to the integrated circuits. The elevated temperature and the applied signals may exceed normal operating parameters. Once an integrated circuit has passed a test during or after burn-in, the chances of it functioning throughout its intended service life are greatly increased.

Burn-in may be done at various times. In many cases, burn-in is done when the IC is in its final packaged form. In such a case, the IC is plugged into a circuit board that allows the required electrical signals to be applied to the IC. Burn-in of packaged IC's has the advantage that the packaged IC is much less sensitive to physical damage or contamination, and can easily be plugged into the burn-in circuit board to make the required connections. Disadvantages of burning-in packaged IC's are that the added expense of packaging the IC is lost if the IC fails during burn-in, that there are many more individual components to handle, and that the same die type may end up in a number of different package types requiring different fixtures for burn-in.

Another burn-in option is to put individual dies into reusable packages, and then burn-in the die in the reusable package in a similar manner to the burn-in of packaged IC's. This method has the advantage that less has been invested in the IC at this time, but has the disadvantage that the individual dies are difficult to handle conveniently, and are susceptible to damage or contamination.

The cartridge of the invention is used for wafer-level burn-in. That is, the integrated circuit wafer undergoes burn-in before separation into individual dies and traditional packaging. Wafer-level burn-in has the advantages that failure-prone IC's are identified early, that for certain chip types (e.g., DRAM) there is the possibility of laser-repairing burn-in defects, and that wafer maps of burn-in failures are easily generated. Wafer maps assist in identifying and rectifying wafer processing flaws. Wafer-level burn-in has the disadvantages that careful handling of the wafer is required, and that making electrical contact with the wafer is more difficult. An example of a fixture used for wafer-level burn-in is shown in US Pat. No. 5,859,539 to Wood et al.

IC's also typically undergo functional tests at some point. These tests verify that the IC has the required functionality at the desired speed and accuracy. The functional tests can be used to reject IC's entirely, or may be used to classify IC's into different grades.

The cartridge of the invention may be used for wafer-level burn-in and/or testing.

SUMMARY OF THE INVENTION

According to the invention there is provided a method of burning-in or testing a wafer, comprising the steps of placing the wafer on a chuck plate; aligning a probe plate with the wafer; and locking the chuck plate and the probe plate together. Preferably the step of placing the wafer on the chuck plate comprises the step of aligning the wafer with the chuck plate to within a first tolerance and the step of aligning the probe plate with the wafer is done to within a second tolerance, the first tolerance being greater than the second tolerance.

Also according to the invention there is provided a cartridge for wafer-level burn-in or test, comprising a chuck plate to receive a wafer, a probe plate to establish electrical contact with the wafer, and a mechanical connecting device to lock the chuck plate and the probe plate fixed relative to one another. Preferably, the probe plate includes a probe card movably coupled to the probe plate. More preferably, the probe card is mounted to the probe plate by at least two leaf springs and there is a piston slidably located in a recess formed in the probe plate behind the probe card.

Yet further according to the invention there is provided a kinematic coupling comprising a male connector including an undercut surface; and first and second opposed jaws. Each of the jaws is movable from a retracted position in which the male connector can be inserted between the jaws and an engaging position in which the jaws prevent withdrawal of the male connector from between the jaws by engaging the undercut surface of the male connector. Preferably the first and second jaws are biased towards their respective engaging positions, and the first and second jaws each include an inclined surface that can be acted upon by a key to move the first and second jaws into their respective retracted positions. More preferably, the male connector is movably coupled to a substrate such that, when the male connector is inserted between the first and second jaws and the first and second jaws are both in their engaging positions, the male connector is movable relative to the substrate between an extended position in which the engaging surface of the male connector is not in contact with the first and second jaws and a retracted position in which the engaging surface of the male connector is in contact with the first and second jaws. Even more preferably, the male connector is biased towards its retracted position, thereby to provide a positive clamping force.

Still further according to the invention there is provided a wafer level burn-in or test cartridge, comprising:

a first plate;

a second plate;

a male connector that is mounted to the first plate, the male connector including an undercut surface; and at least one jaw that is movably coupled to the second plate, the jaw being movable from a retracted position in which the male connector can be received by the jaw and an engaging position in which the jaws prevent withdrawal of the male connector from the jaw by engaging the undercut surface of the male connector.

Further details of the invention are set forth in the section entitled: "Description of Specific Embodiments."

BRIEF DESCRIPTION OF THE DRAWINGS

FIGS. 3 and 4 are two views of a leaf spring for use in the cartridge of FIG. 1;

DESCRIPTION OF SPECIFIC EMBODIMENTS

Figure 1:
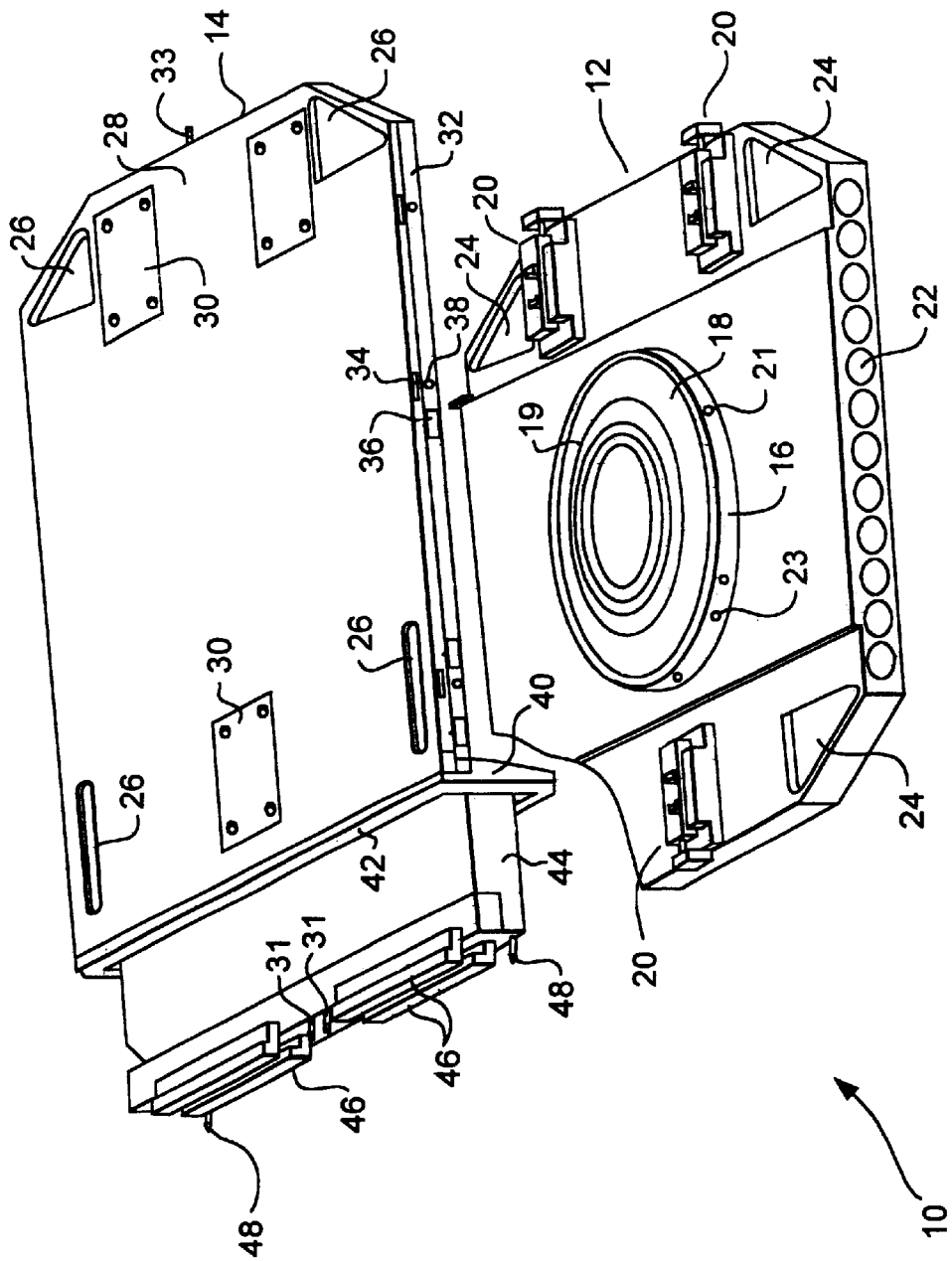
FIG. 1 is a perspective view of a wafer-level burn-in and test cartridge according to the invention.

A wafer-level burn-in and test cartridge according to the invention is illustrated in FIG. 1. The cartridge, generally indicated by the reference numeral 10, comprises a chuck plate 12 and a probe plate 14. The chuck plate 12 and the probe plate 14 may be made of any suitable material. In the illustrated embodiment, the chuck plate 12 and the probe plate 14 are made of 6061 aluminum.

The chuck plate 12 is generally rectangular in shape, and includes a centrally-located raised pedestal In use, a semiconductor wafer is placed on the upper surface 18 of the pedestal 16. Mounted to the upper surface of the chuck plate 12 are the lower halves 20 of three mechanical connecting devices that are used to lock the chuck plate 12 and the probe plate 14 together in use. In the illustrated embodiment, the mechanical connecting devices are kinematic couplings, which are discussed below in more detail with reference to FIGS. 6 to 12. Formed transversely through the chuck plate 12 are a number of channels 22 that have air or another fluid circulated through them in use to cool or heat the chuck plate 12. Formed around the edges of the chuck plate 12 are a number of handhold recesses 24 that encourage an operator to pick the chuck plate up away from the pedestal 16 or the lower halves 20 of the mechanical connecting devices. The chuck plate 12 may also be provided with vertical holes (usually three) extending between the upper surface of the pedestal and the bottom surface of the chuck plate 12. Such holes may be used for the insertion of wafer-lift pins that are used in some wafer alignment systems.

The probe plate 14 is also generally rectangular in shape, and also has a number of handhold recesses 26 formed in its upper surface 28 to encourage an operator to pick the probe plate 14 up away from the sensitive areas of the probe plate. Also shown on the upper surface of the probe plate are access covers 30 by means of which access can be gained to the upper halves (not shown) of the mechanical connecting devices.

Also shown on the probe plate 14 are a number of nipples 31, 33 whereby pneumatic connections can be made to the cartridge 10. Pneumatic and/or vacuum actuation is used in the operation of various parts of the cartridge as will be described in more detail below. While the actuation described below is effected by varying the pressure of air, it will be appreciated that other fluids could also be used in the invention.

Located on each side of the probe plate 14 is a rail 32 (one side shown.). Mounted in each rail are a number of vertically-oriented wheels 34 and a number of horizontally-oriented wheels 36. The wheels 34, 36 are mounted on shafts 38, and in the preferred embodiment the wheels are small ball bearings. In use, the rails 32 slide into correspondingly shaped channels in a burn-in chamber, with the vertically-oriented wheels 34 supporting the cartridge 10 on the lower surface of the channels and with the horizontally-oriented wheels preventing the rails 32 from sliding against the sidewalls of the channels. The channels in the burn-in chamber may extend beyond the ends of adjacent inserted cartridges, to further facilitate insertion of the cartridge in the burn-in chamber.

Located at one end of the probe plate 14 is a vertical flange 40. Attached to the flange 40 is a connector block 44 that has a number of electrical connectors 46 mounted thereto. In use, the electrical connectors 46 are used to establish electrical connection with the wafer. Mounted to the flange 40 around the connector block 44 is a seal 42. In use, the cartridge 10 is slid connector-side first into a high temperature section of the burn-in chamber, until the connector block 44 protrudes out of the high-temperature section into a lower temperature section through an aperture in a rear wall of the burn-in chamber. The seal 42 then serves to seal against the wall around the aperture, thereby isolating the connector block from the conditions in the high-temperature section of the burn-in chamber. The connector block 44 is made of a high temperature polymer such as Ultem, which is a thermal insulating material that serves to insulate the electrical connectors 46 from the high temperatures to which the flange 40 is exposed in use. Finally, mounted to the connecting block 44 are two alignment pins 48 that serve to align the connectors 46 with corresponding electrical connectors when the cartridge 10 is slid into the burn-in chamber.

Figure 2:
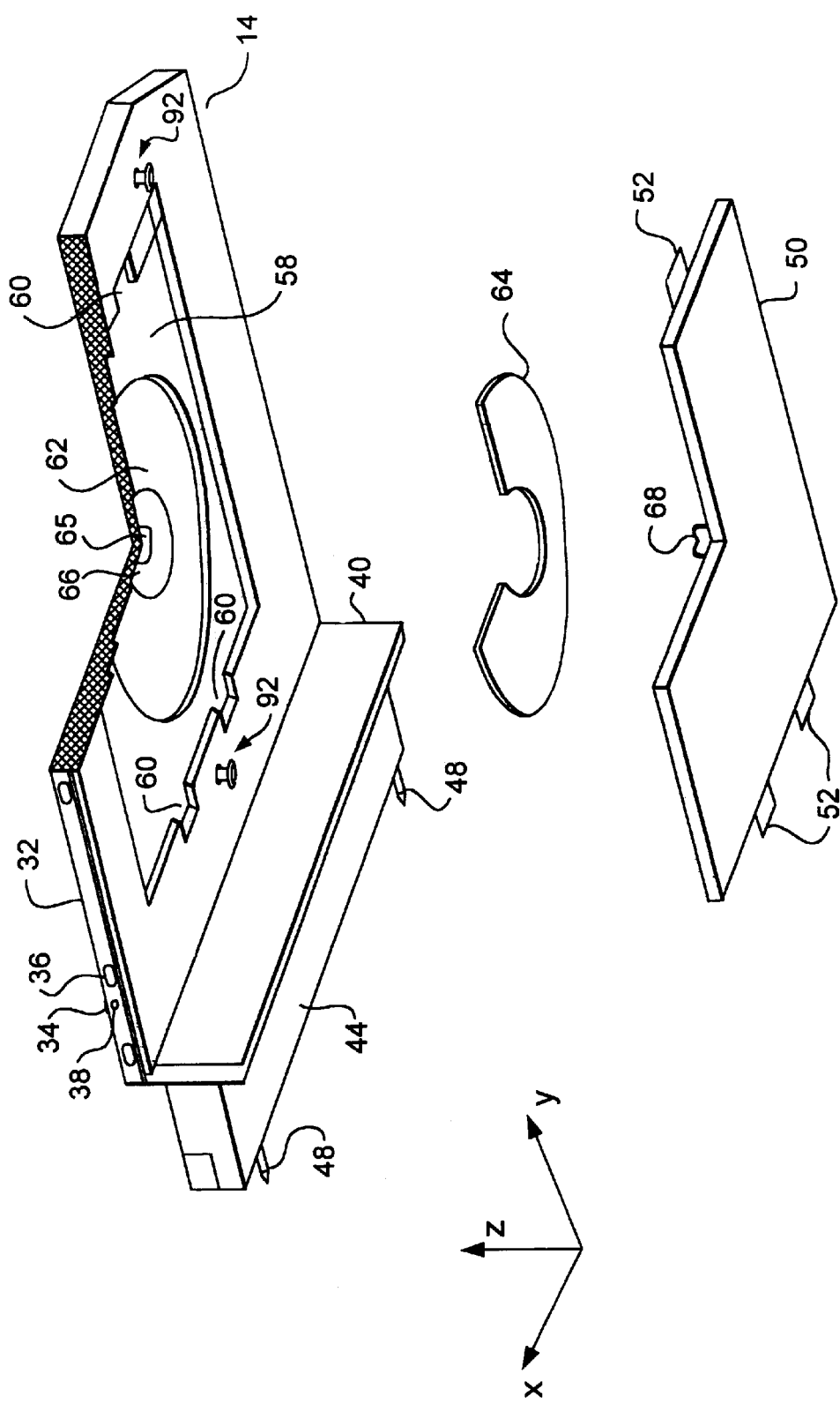
FIG. 2 is a partially cut away and exploded perspective view of the probe plate of the cartridge shown in FIG. 1.

FIG. 2 shows the underside of the probe plate 14, as well as a further component of the cartridge, the probe card 50. The probe card 50 is the part of the cartridge that actually makes direct electrical contact with the wafer during wafer-level burn in and/or test, and the probe card 50 is thus different for each different type of wafer undergoing burn-in and/or test. The probe card 50 is electrically connected to the electrical connectors 46 by means of printed circuit boards as is described in more detail in the concurrently filed, copending, commonly owned patent application entitled: "Wafer Level Burn-in and Electrical Test System and Method" (Attorney Docket Number AEHR-007/00US,) the disclosure of which is incorporated herein by reference.

The probe card 50 is preferably made of a material that is thermally matched with the semiconductor material from which the wafer is made. That is, when heated, the probe card 50 and a wafer under test will expand by similar amounts. This ensures that the electrical contact between the probe card 50 and a wafer under test is not disturbed as the cartridge is heated in a burn-in chamber. This permits the probe card 50 to be aligned with the wafer when the wafer is at room temperature, before exposure to the elevated temperatures of burn-in. For example, the probe card 50 may be made of silicon-carbide, which provides a good thermal match with a silicon wafer. However, it should be noted that the particular details of the probe card 50 do not form part of the invention, and currently available and future-developed probe cards 50 can advantageously be used in the cartridge and methods of the invention. For example, a probe card that is suitable for use in the cartridge and methods of the invention can be purchased from the Electronics Division of W. L. Gore & Associates, Inc. of Delaware.

The probe card 50 is mounted to the probe plate 14 by means of four leaf springs 52 that are spaced around the perimeter of the probe card 50. The leaf springs 52 permit relative motion between the probe plate 14 and the mounted probe card 50 along the z-axis (that is, perpendicular to the surface of a wafer located on the pedestal 16). The leaf springs 50 also permit the probe card to rotate to some degree relative to the probe plate 14 around the x or y-axes (i.e., rotation about perpendicular axes both being parallel to the surface of the wafer). The leaf springs 52 however prevent substantial movement of the probe card 50 relative to the probe plate 14 along the x or y-axes, and also prevent substantial rotation of the probe card 50 relative to the probe plate 14 about the z-axis. Preferably, the leaf springs 52 are spaced about the circumference of the probe card 50 to provide a substantially maximum resistance to rotation of the probe card relative to the probe plate about the z-axis. When the probe card is rectangular as shown, this is accomplished by locating a leaf spring 52 at or near each of the four corners of the probe card 50.

This leaf spring mounting arrangement permits the probe card 50 to be moved into and out of contact with a wafer located on the pedestal 16, and permits the probe card to "settle" evenly onto a wafer if one edge or area of the probe card 50 contacts the wafer first. However, misalignment of the probe card 50 and the wafer is minimized during application of the probe card to the wafer, since the leaf springs 52 resist translation of the probe card 50 across the surface of the wafer and also resist rotation of the probe card 50 around an axis perpendicular to the surface of the wafer.

One of the leaf springs 52 is shown in more detail in FIGS. 3 and 4. As can be seen from FIG. 4, the leaf spring 52 has a non-linear profile. More particularly the leaf spring 52 includes a curved central portion 54 in the shape of a channel that extends across the width of the leaf spring 52. The central portion 54 permits the leaf spring to deform predictably under compression forces F that might otherwise cause the leaf spring 52 to buckle unpredictably. The central portion 54 also ensures that the different leaf springs 52 behave in a substantially uniform manner under tension or compression, providing uniform compliance around the probe card 50. The predictable compliance of the leaf spring under compression or tension also permits the mounting arrangement to compensate predictably for any changes in dimension resulting from any mismatch of the thermal coefficients of expansion of the probe card and probe plate materials. The leaf spring 52 includes four holes 56 defined therein whereby the leaf spring can be screwed to the probe card and to the probe plate.

By way of example only, a leaf spring for use in the cartridge of the invention has a width of 0.8" (20.3 mm,) a length of 1.23" (31.2 mm,) a thickness of 0.010" (0.254 mm) and the central portion 54 has an approximate radius of 0.31" (7.87 mm.). The leaf spring 52 is made of beryllium copper, but may be made of any suitable spring material.

Returning now to FIG. 2, it can be seen that the probe plate 14 defines a recess 58 for receiving the probe card 50-The recess 58 includes four notches for receiving the leaf springs 52.

Defined in the center of the recess 58 is a cylindrical recess 62 that receives a thin cylindrical piston 64. Defined in the center of the recess 58 is a further cylindrical recess 65 that has a sleeve 66 mounted therein. When the probe card is mounted to the probe plate 14 with the piston 64 received in the recess 62, a guide plug 68 mounted on the back of the probe plate 50 is located in the sleeve 66. The guide plug 68 serves to provide additional alignment and guidance of the probe card 50 as it moves towards and away from the wafer.

Figure 5:
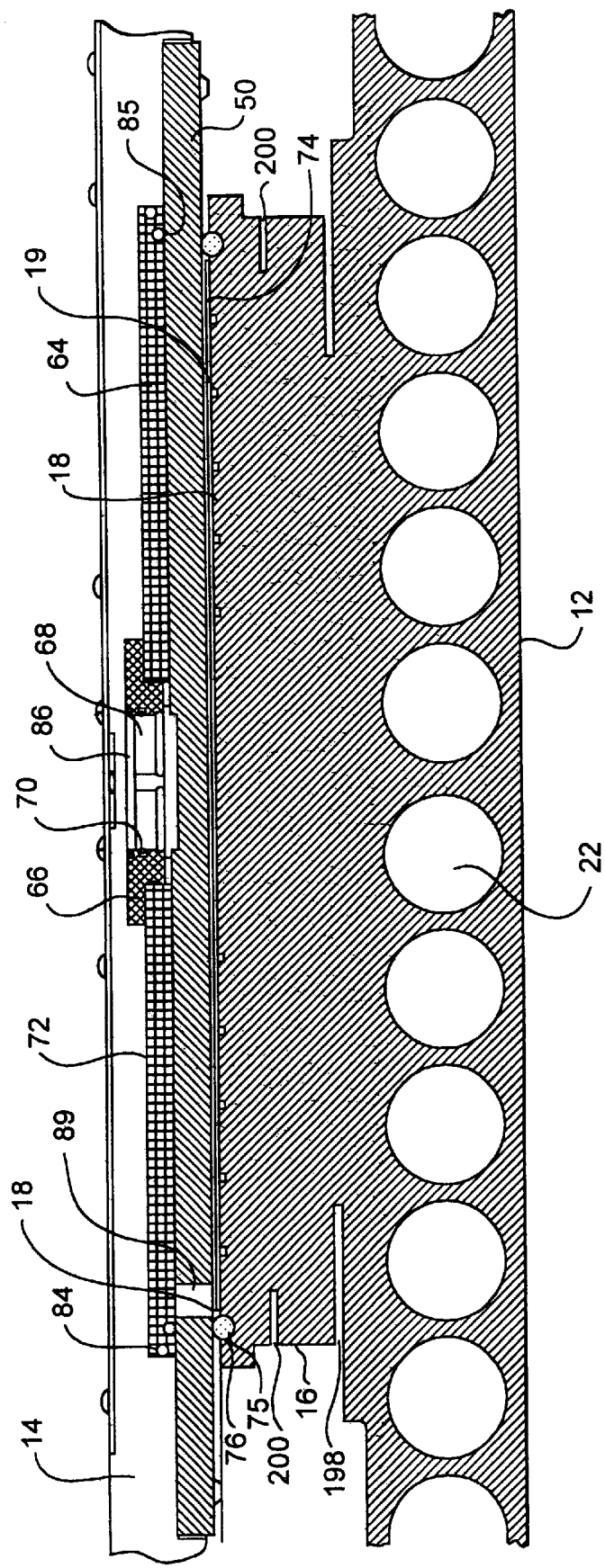
FIG. 5 is a partial cross sectional view through the cartridge of FIG. 1.
Figure 18:
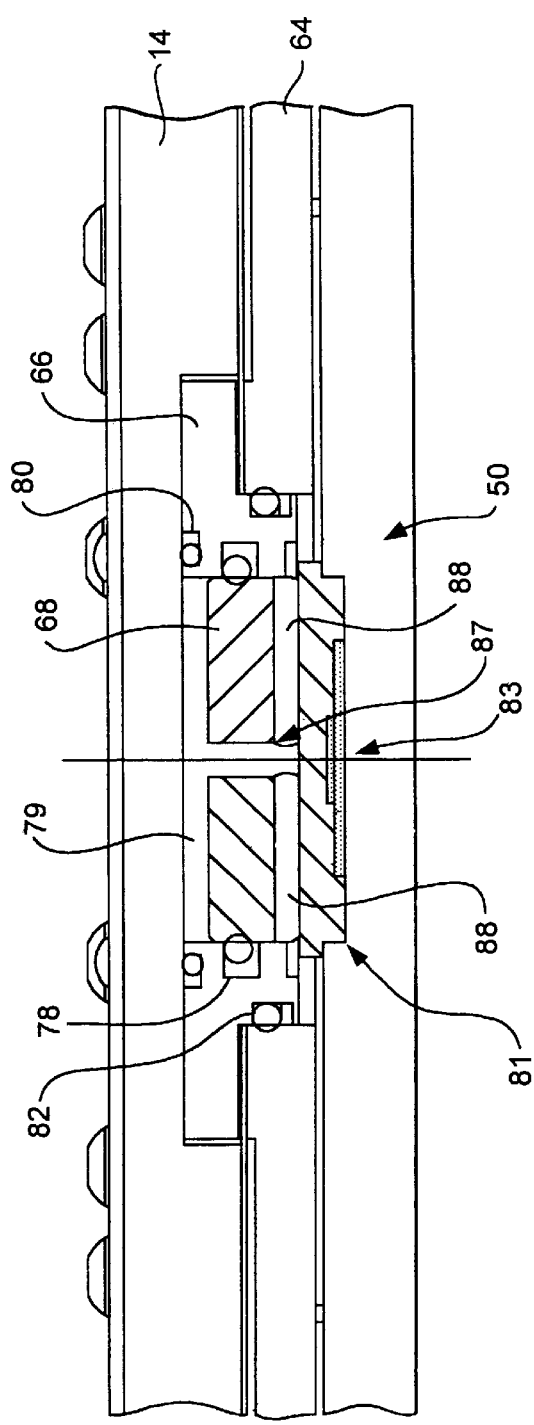
FIG. 18 is an enlarged cross-sectional partial view of the chuck plate, piston, probe card and related components of the cartridge of FIG. 1.
Figure 19:
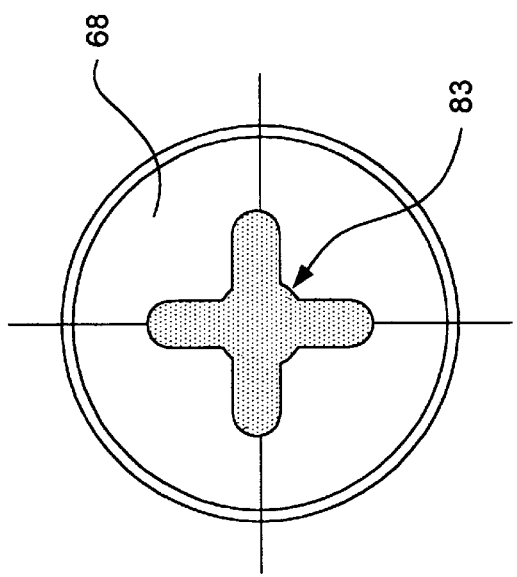
FIG. 19 is a plan view of the lower surface of the alignment plug of FIG. 18 to illustrate the shape and size of the epoxy bond between the probe card and the alignment plug.

The relationship between the probe card 50, the piston 64 and the probe plate 14 is shown in more detail in FIGS. 5 and 18. FIG. 5 also shows the relationship in use between these components and the chuck plate 12, having a wafer 74 positioned thereon, and FIGS. 18 and 19 show how the probe card 50 is mounted to the guide plug 68.

The probe card 50 is mounted to the guide plug 68 by means of an epoxy bond 83. The epoxy used is typically a Loctite™ aerobic adhesive. By mounting the probe card 50 at its center using a small area of epoxy 83, thermal mismatch between the probe card 50 and the rest of the cartridge is minimized, since the probe card 50 is free to expand or contract relative to the rest of the cartridge. To center the probe card 50 relative to the alignment plug 68 during bonding, and to provide a degree of compliance between the alignment plug 68 and the probe card 50, a strip of Teflon™ tape 81 is provided around the lower circumference of the alignment plug 68.

As can be seen from the figures, the sleeve 66 has a cylindrical inner bore that receives the guide plug 68.

Formed in the sleeve 66 are three grooves—a groove 78 in the bore 70, a groove 80 in the upper surface of the sleeve 66 and a groove 82 in the stepped outer surface of the sleeve 66. These three grooves have O-rings received therein as shown. Similarly, the piston 64 has one groove 84 formed in its edge (circumference) and one groove 85 formed in its lower surface. These grooves in the piston also have O-rings received therein. These five O-rings serve to provide an airtight seal between the 30 space 72 behind the piston and the general vicinity of the wafer. Accordingly, by increasing the air pressure in space 72 behind the piston 64, the piston (and hence the probe card 50) can be advanced towards the wafer 74. Similarly, by reducing the pressure in space 72, the piston 64 (and hence the probe card 50) can be retracted from the wafer 74. This is done via a conduit formed in the probe plate between the space 72 and one of the nipples 31 located on the exterior of the probe plate 14.

Alternatively, if the pressure in the space 72 is left unchanged, the piston can be moved by varying the pressure in the general vicinity of the wafer 74, thereby creating a pressure differential between different sides of the piston 64 as before, except reversed in action. That is, by decreasing the air pressure in the general vicinity of the wafer 74, the piston (and hence the probe card 50) can be advanced towards the wafer 74. Similarly, by increasing the pressure in the general vicinity of the wafer 74, the piston 64 (and hence the probe card 50) can be partially retracted from the wafer 74. Manipulation of the air pressure in the vicinity of the wafer 74 is done via a conduit formed in the probe plate 14 that provides fluid communication between one of the nipples 31 and a region 79 behind the guide plug 68 (see FIG. 18). The region 79 is in turn in fluid communication with a region between the piston 64 and the probe card 50 via an axial bore 87 and one or more transverse bores 88 formed in the guide plug 68. The area between the probe card 50 and the piston 64 is in turn in fluid communication with the immediate vicinity of the wafer 74 via a hole 89 formed in the probe card 50. Thus, when the pressure in the region 79 is reduced, there is a corresponding reduction in the pressure in the vicinity of the wafer 74. If the piston 64 is to be moved by a reduction of the air pressure in the vicinity of the wafer 74, an O-ring 75 is provided in an annular groove 76 defined in the upper surface 18 of the pedestal 16. The probe card 50 abuts the O-ring 75 in the groove 76 to seal the area in the vicinity of the wafer 74. The use of an O-ring 75 in the groove 76 also assists in maintaining cleanliness of the wafer 74.

As an alternative to the routing described in the previous paragraph for reducing the pressure in the vicinity of the wafer 74, the vacuum path may travel for a short distance in the probe plate 14 from the nipple 31 before being transferred to the chuck plate 12 by means of a pneumatic seal. The vacuum would then be conveyed through the chuck plate 12 to the vicinity of the wafer 74 via a passage formed in the chuck plate 12.

The nipples 31 that are used in the control of the movement of the piston 64 are of the type that close when the pneumatic lines coupled to the nipples 31 are removed. This means that after the probe card 50 is advanced against the wafer 74 with the required probe actuation force, the cartridge can be disconnected from the pneumatic lines, and the required probe actuation force is then maintained independently by the cartridge 10. This has the advantage that the burn-in of the wafer can be done separately from the expensive equipment required to align the wafer and probe card, and a separate mechanism to provide the probe actuation force is not required. It should be noted however that pneumatic connection with the cartridge 10 is typically reestablished in the burn-in chamber. This permits the various pressure differentials to be maintained (in case of leaks,) and also permits the pressure differentials to be maintained constant as the cartridge is heated or cooled.

Figure 6:
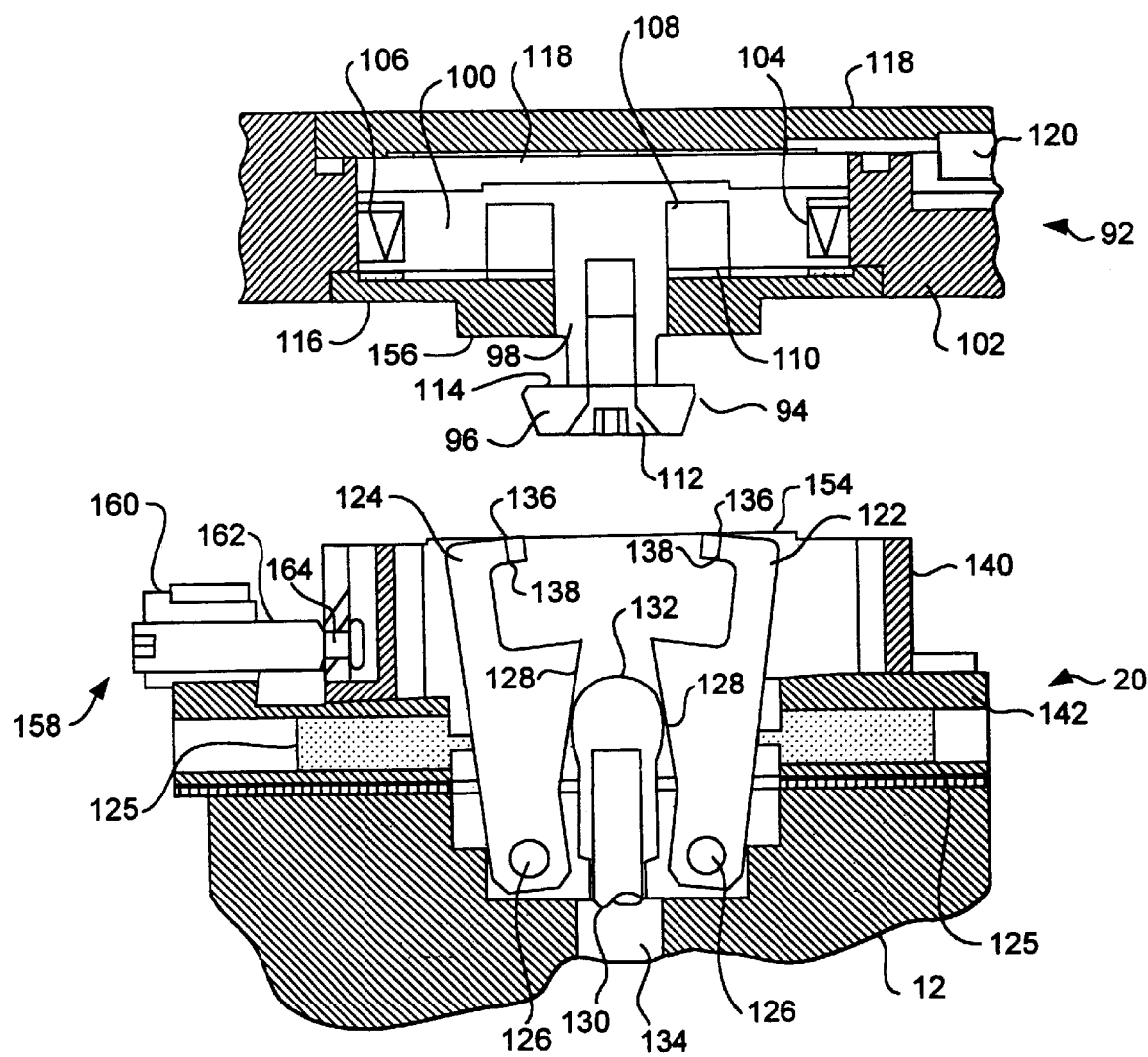
FIG. 6 is a cross sectional view of the mechanical connecting device of the cartridge of FIG. 1.
Figure 14:
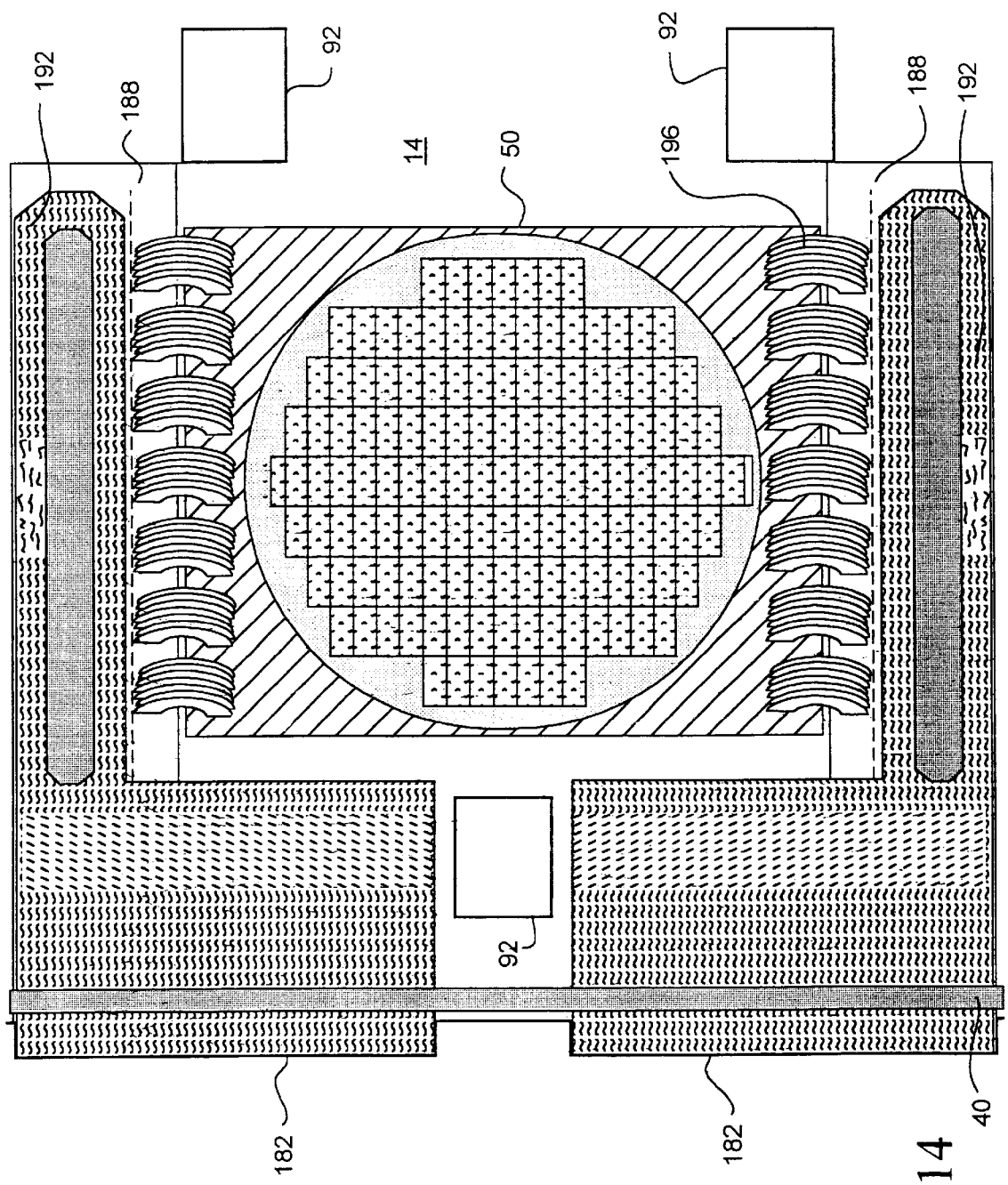
FIG. 14 is a schematic view of the underside of the probe plate of the cartridge of FIG. 1.

The cartridge also includes three mechanical connecting devices 90 as shown in more detail in FIG. 6. The connecting devices 90 are used to clamp the chuck plate 12 and the probe plate 14 together. The connecting device 90 comprises a lower portion 20 and an upper portion 92 that are located as shown in FIGS. 1, 2 and 14. While the terms "upper" and "lower" are used here for convenience, it will be appreciated that these two portions of the connecting device may be used in any functional orientation.

The upper portion 92 of the connecting device includes a male connector 94. The male connector 94 includes a head 96 and a neck 98. At the base of the neck 98, the male connector defines a cylindrical piston 100 whereby the male connecting device is movably mounted to the substrate 102. In the illustrated embodiment, the substrate 102 is the probe plate 14. Located in a groove 104 defined in the edge of the piston 100 is a seal 106 that serves to seal the interface between the piston 100 and the substrate 102. Located in an annular groove 108 around the neck 98 of the male connector are several Belleville springs 110. The head 96 defines an undercut surface 114, and is mounted to the neck 98 by means of a bolt 112. On either side of the piston 100 are cover plates 116 and 118 that are mounted to the substrate 102. The springs 110 bear respectively against the bottom surface of the groove 108 and the cover plate 116, thereby to bias the male connector 94 into a retracted position. Defined between the piston 100, the cover plate 118, and the substrate 102 is a space 118. The space 118 is connected to the nipples 33 shown in FIG. 1 via a conduit 120. By introducing high-pressure air into the space 118 via the conduit 120, the male connector 94 can be advanced against the bias of the springs 110 into an extended position.

Figure 7:
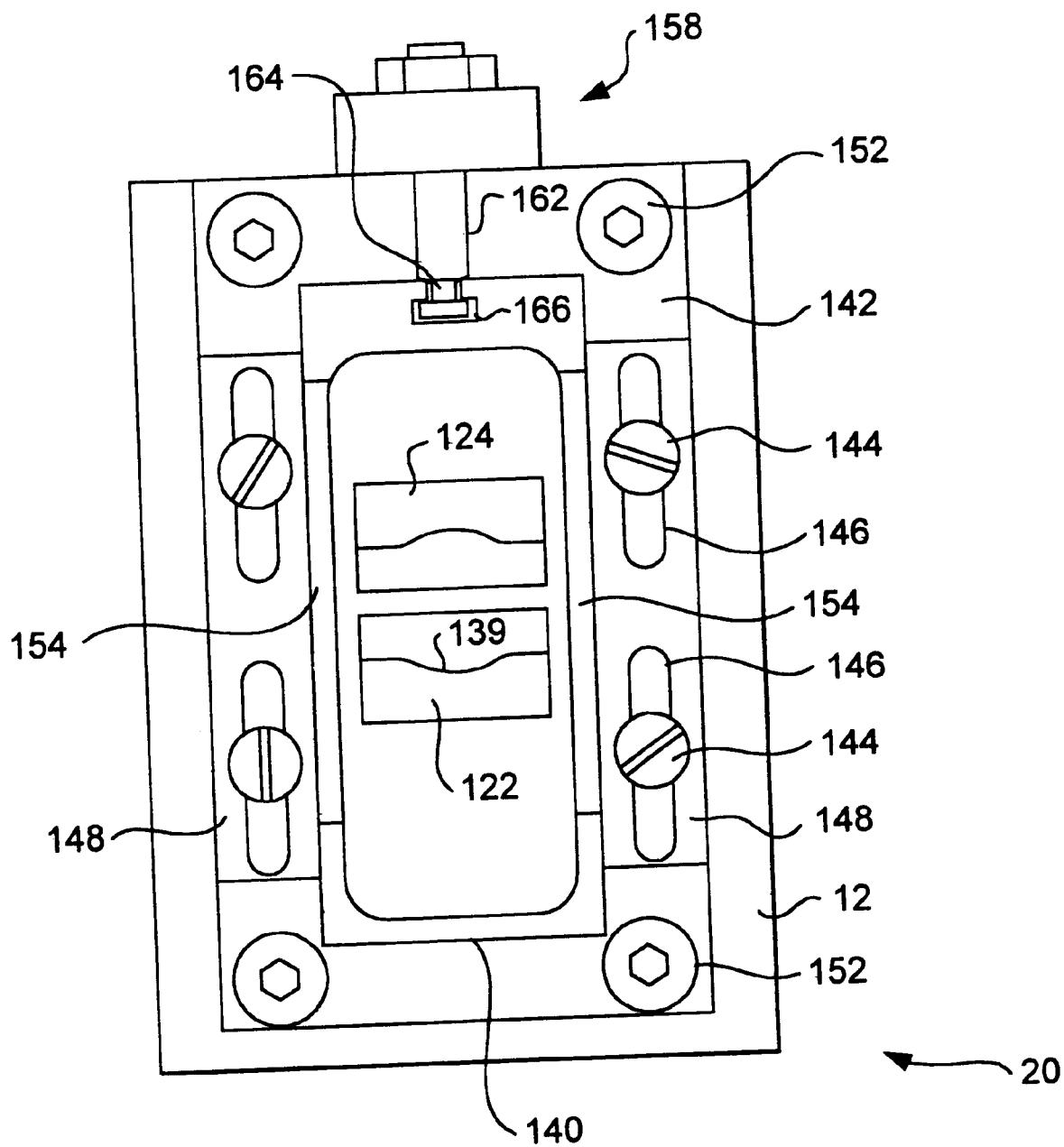
FIG. 7 is a top view of the lower portion of the connecting device of FIG. 6.

Referring now to FIGS. 6 and 7, the lower portion 20 of the mechanical connecting device 90 is seen to include first and second opposed jaws 122, 124. The jaws 122, 124 are pivotally mounted to the chuck plate by means of pivot pins 126. This mounting arrangement permits the jaws 122,124 to pivot from a retracted position (shown in FIG. 6) in which the male connector 94 can be inserted between the jaws 122, 124, and an engaging position (shown in FIG. 8C) in which the jaws 122, 124 prevent withdrawal of the male connector 94 therefrom by engaging the undercut surface 114 of the male connector 94. The jaws are biased towards their engaging position by means of two spring plungers 125 that are located in threaded bores 127 formed in an inclined wedge 142. The spring plungers each have a threaded outer surface that permits them to be selectively positioned in the bores 127.

The first and second jaws 122, 124 each include an inclined surface 128 that can be acted upon by a key or probe 130 to move the jaws 122, 124 from their engaging positions into their retracted positions. The probe or key 130 includes a spherical head 132, and is inserted through a hole defined in the chuck plate 12. The jaws 122, 124 each include a protruding lip 136 that has an undercut surface 138 that engages the undercut surface 114 of the male connector 94 in use. As can be seen in FIG. 7, the front surface of the lip has circular notch formed therein so that the head 96 can be received without undue retraction of the jaws 122, 124.

Surrounding the jaws 122, 124 is an adjustable stop 140. The adjustable stop 140 is mounted on top of the inclined wedge 142 by means of four screws 144. The screws 144 pass through slots 146 defined in two flanges 148 that extend from the lower edges of the stop 140. The wedge 142 is mounted to the chuck plate 12 by means of four bolts 152. The upper edges of the stop include central raised portions 154 against which a corresponding raised portion 156 of the cover plate 116 abuts when the connecting device 90 is engaged as will be described in more detail below.

An adjusting mechanism 158 is mounted at one end of the wedge 154. The adjusting mechanism 158 includes an internally threaded barrel 160 and an externally threaded rod 162. The rod 162 has a hexagonal recess defined therein by means of which an allen wrench can be used to rotate the rod, thereby to advance or retract it. The rod 162 has a groove 164 defined therein that permits one end of the rod to be received by a vertical, T-shaped groove 166 in the stop 140. To adjust the height of the raised portion 156 above the chuck plate 12, the screws 144 are loosened and the rod 160 is rotated to advance or retract the stop 140 along the inclined wedge 142. When the desired adjustment has been made, the screws 144 are retightened. By adjusting the stops 140 of all three lower portions 20 of the mechanical connecting devices 90, the distance between the chuck plate 12 and probe plate 14 (when they are clamped together) can be varied. Referring to FIG. 5, it will be appreciated that this adjustment permits the cartridge to be adapted to probe cards and wafers of different sizes, and also to make fine adjustments to the relationship between the wafer 74 and the probe card 50.

While the mechanical connecting device 90 has been described as having a configuration that has the male connector 94 normally retracted, and the jaws 122, 124 normally closed, it will be appreciated that this arrangement may be varied to provide a male connector that is normally extended and jaws 122, 124 that are normally open.

The sequence of operation of the mechanical connecting device 90 is shown in FIGS. 8A to 8D. As shown in FIG. 8A, the key or probe 130 is advanced between the first and second jaws 122, 124 against the inclined surfaces 128, thereby to move the jaws 122, 124 from their engaging positions into their retracted positions. The space 118 is pressurized to advance the piston 100 (and hence the male connector 94) in the direction of the chuck plate 12. The chuck plate 12 and the probe plate 14 are then moved together to position the head 96 of the male connector between the jaws 122, 124 as shown in FIG. 8B. The clearances between the head 96 and the retracted jaws 122, 124 is sufficient to allow lateral misalignment (i.e., in a direction parallel to the surface of the wafer 74) of the chuck plate 12 and the probe plate 14 in an amount that is greater than the expected variation in the positioning accuracy of the wafer on the chuck plate 12. In the illustrated embodiment, the connecting mechanisms 90 can be engaged over a range of relative lateral movement of the chuck plate 12 and the probe plate 14 of +/−0.05" (+/−1.27 mm). As will be discussed in more detail below, this permits the wafer 74 to be positioned relatively crudely on the pedestal 16. Accurate alignment of the probe card 50 with the wafer is then done directly—by aligning the probe plate 14 with the wafer 74—without having to be concerned about bow the probe plate 14 and chuck plate are going to mate. The probe plate 14 and the chuck plate 12 can then be locked together to maintain the alignment between the probe plate 14 and the wafer 74. Aligning the probe plate 14 directly with the wafer 74 in this manner avoids the buildup of tolerances that would occur if the wafer was aligned indirectly with the probe plate 14 by first aligning it with the chuck plate 12 and then aligning the probe plate 14 with the chuck plate 12.

Exemplary figures for the tolerance required of the alignment between the wafer 74 and the probe card 50 are the same as those for alternative wafer-level burn-in and test solutions, e.g., +/−0.001" (+/−12.5 micron) (based on the Gore probe card alignment pad 30 geometry,) +/−0.0005" (+1.25 micron) (for NHK pogo pin adapter plate pin placement.). It will however be appreciated that the tolerance required of the alignment between the probe card 50 and the wafer 74 is dependant on the particular type of integrated circuit formed on the wafer, the size and pitch of the contact pads on the wafer, and the particular probe card being used. As feature sizes decrease in semiconductor device fabrication, the required alignment tolerances will decrease in a corresponding manner. Accordingly, it should be noted that the figures quoted above are only examples used to illustrate the general relationship between the coarse alignment of the wafer on the chuck plate 12 and the fine alignment between the probe card 50 and the wafer 74.

As can be seen from FIG. 8C, the probe or key 130 is then withdrawn from between the jaws 122, 124, thereby to permit the jaws 122, 124 to return to their engaging positions. The space 118 behind the piston 100 is then depressurized and the male connector 94 is retracted under the biasing effect of the springs 110, as shown in FIG. 8D. As the male connector 94 retracts, the undercut surface 114 of the male connector 94 engages the undercut surfaces 138 of the jaws 122, 124. This draws the chuck plate 12 and the probe plate 14 together, until the central raised portion 154 of the stop 140 abuts the raised portion 156 of the cover plate 116. It should be noted that in the engaged position of the mechanical connecting device 90 shown in FIG. 8D, the springs 110 are still compressed, which provides a positive clamping force between the chuck plate 12 and the probe plate 14. In the illustrated embodiment, the clamping force of each mechanical connecting device when fully engaged, as shown in FIG. 8D, is between 165 and 230 pounds (735 to 1020 N,) to provide a total clamping force of 500 to 700 pounds (2.2 to 3.1 kN) for the cartridge 10. When filly engaged, the probe plate 14 and the chuck plate 12 are prevented from separating by this clamping force, and are prevented from translating relative to one another by frictional engagement of the surfaces 154 and 156. Frictional engagement between the probe card 50 and the wafer 74 also assist in preventing the probe plate 14 and the chuck plate 12 from translating relative to one another.

It should also be noted that the springs 110 also assist in preventing the buildup of undesirable thermal stresses in the clamped cartridge, since the springs 100 permit movement of the male connector 94 in response to any thermally-induced changes of dimension along the longitudinal axis of the male connector 94.

To disengage the mechanical connecting device, the procedure described above with reference to FIGS. 8A to 8D is executed in reverse.

Figure 8:
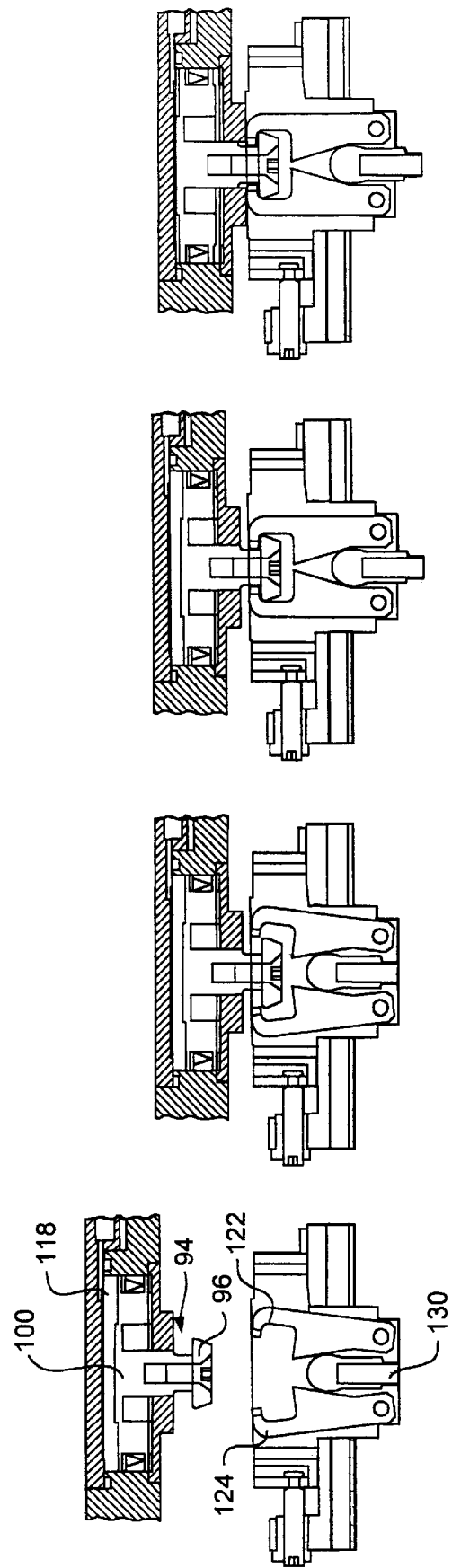
FIGS. 8A to 8D illustrate the actuation of the mechanical connecting device of FIGS. 6 and 7.
Figure 9:
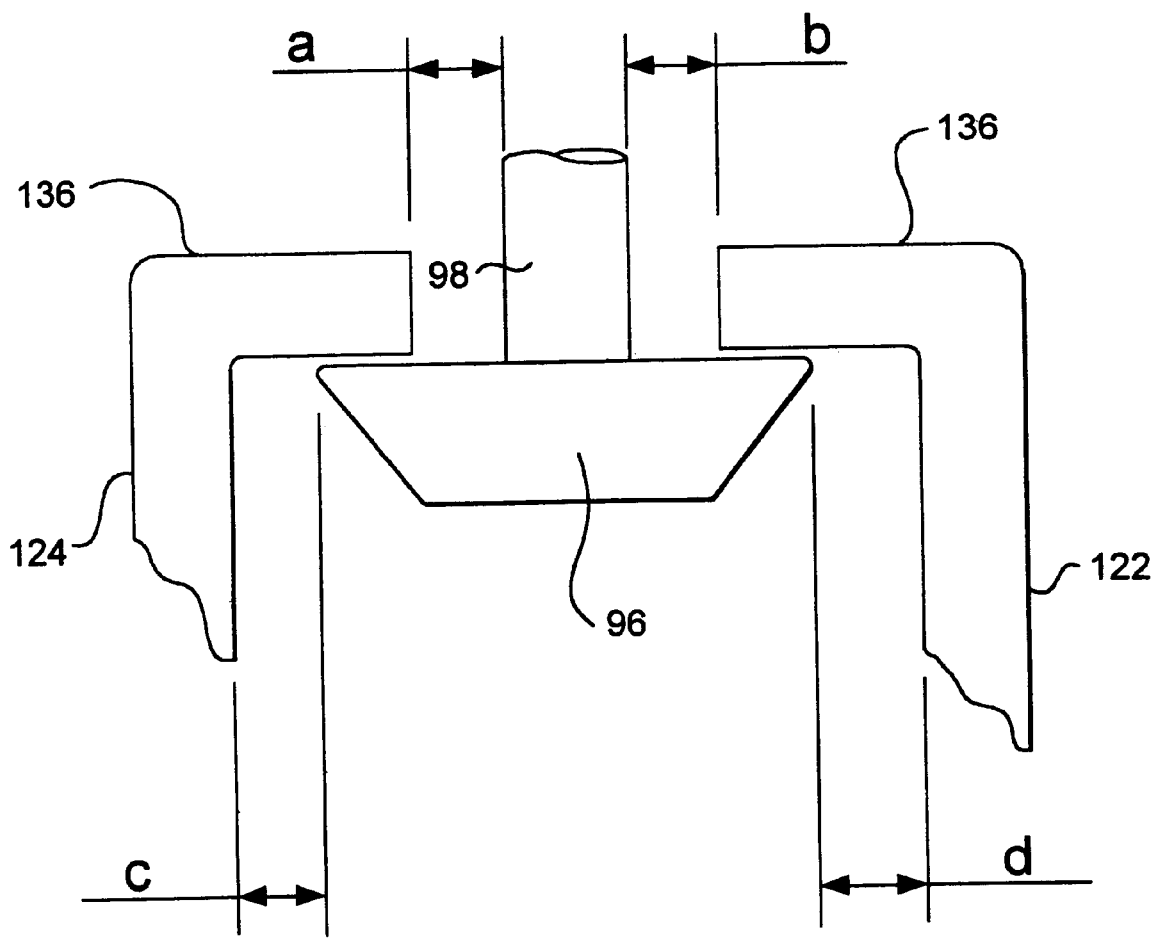
FIG. 9 is a schematic view of the relationship between the male connector and the jaws of the mechanical connecting device of FIG. 6.

FIG. 9 is a schematic representation of the relationship between the jaws 122, 124 and the male connector 94 when they are engaged as shown in FIG. 8D. When engaged, it can be seen that there are clearances "a" and "b" between the neck 98 and the edges of the lips 136, and clearances "c" and "d" between the outermost edge of the head 96 and the inner surfaces of the jaws 122, 124. These clearances permit the jaws 122, 124 to engage the head 96 undisturbed even when there is variation in the left-right (in FIG. 9) positioning of the male connector 94 between the jaws 122, 124. Similarly, it will be appreciated that the male connector can be misaligned in a direction perpendicular to the plane of FIG. 9, within limits, without affecting the engagement of the jaws 122, 124 with the head 96. This permits the connecting mechanisms 90 to be engaged over a range of relative lateral movement of the chuck plate 12 and the probe plate 14, as discussed above and below. In the illustrated embodiment, the total lateral misalignment of the chuck plate 12 and the probe plate 14 that can be tolerated by the connecting mechanisms 90 is +/−0.05" (+/−1.27 mm).

Figure 10:
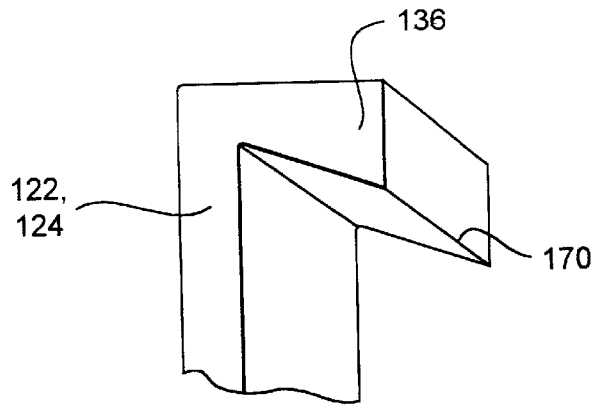
FIGS. 10 to 12 are plan views of alternative configurations of the jaws of the mechanical connecting device of FIG. 6.
Figure 11:
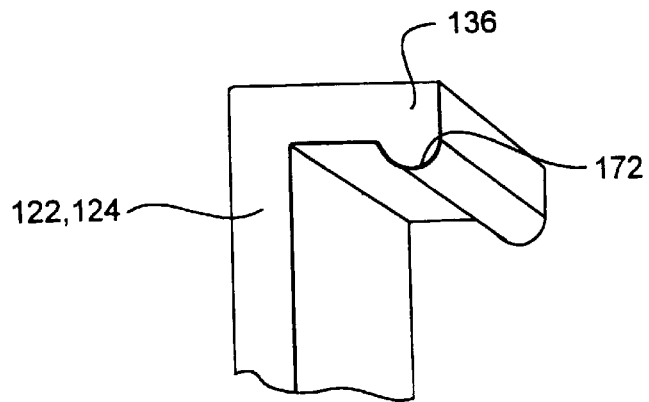
Figure 12:
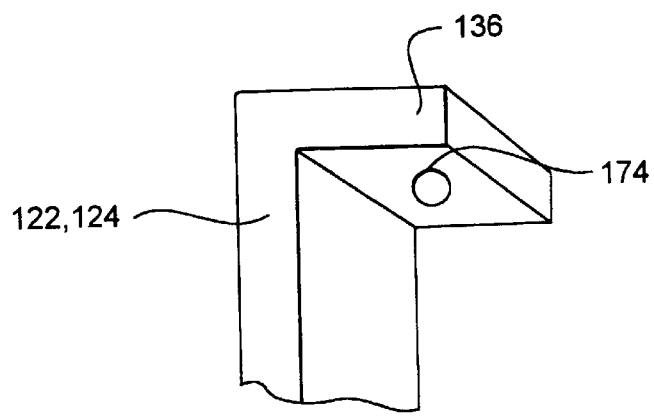

The lip 136 of the jaws 122, 124 may have any one of a number of different profiles, examples of which are shown in FIGS. 10 to 12. As shown in FIG. 12, the lip 136 may have a profile that defines a relatively sharp edge 170 for contacting the undercut surface 114 of the male connector 94 along a single line. Alternatively, the lip 136 may have a semi-cylindrical profile 172 as shown in FIG. 11 that will also provide line contact between the lip 136 and the undercut surface 114 of the male connector 94. Yet further, the lip 136 may include a spherical protrusion 174 as shown in FIG. 12 that provides point contact with the undercut surface 114 of the male connector 94. While these features and shapes have been shown on the jaws 122, 124, it will be appreciated that these or similar features or profiles may be provided on the undercut surface 113 of the male connector 94. Applicants believe that providing line or point contact between the jaws 122, 124 and the undercut surface 114 of the male connector 94 helps prevent the creation of lateral forces during the engaging process described above with reference to FIGS. 8A to 8D. Lateral forces may cause lateral motion of the probe plate 14 and the chuck plate 12, potentially resulting in misalignment of the probe plate 14 and the wafer 74, which is to be avoided.

It should be noted that while the jaws 122, 124 are pivotally mounted to the chuck plate 12, there are alternatives to this arrangement. For example, the jaw(s) may comprise sliding members that are movable between two positions in which the male connector respectively can and cannot be retracted. Also, the jaw may take the form of a plate that has a keyhole-shaped aperture therein, the male connector being insertable in the larger part of the aperture, and being prevented from being withdrawn when the plate is moved relative to the male connector 94 to position the neck 98 of the male connector in the smaller part of the aperture. Accordingly, the term "jaw" can be applied to any arrangement that selectively permits the reception and retention of the male connector.

It is also to be noted that the mechanical connecting device 90 is a kinematic coupling. A kinematic coupling provides forces or movements in controlled and predictable directions. The connecting device 90 is designed to provide motion and a clamping force only in the Z-direction (perpendicular to the wafer) during engagement. By providing forces and movement only in the Z-direction, misalignment between the probe plate 14 and the wafer 74 as a result of the actuation of the clamping device is reduced. Aspects of the mechanical connecting device 90 that contribute to its kinematic nature are the fact that the jaws 122, 124 are pivotally mounted to the chuck plate 12, the fact that there is line or point contact between the head 96 and the jaws 122, 124, the fact that the male connector 94 moves only in the Z-direction, and the fact that transverse motion between the probe plate 14 and the chuck plate 12 is resisted by frictional engagement between two flat surfaces 154, 156 that are perpendicular to the Z-direction.

Figure 13:
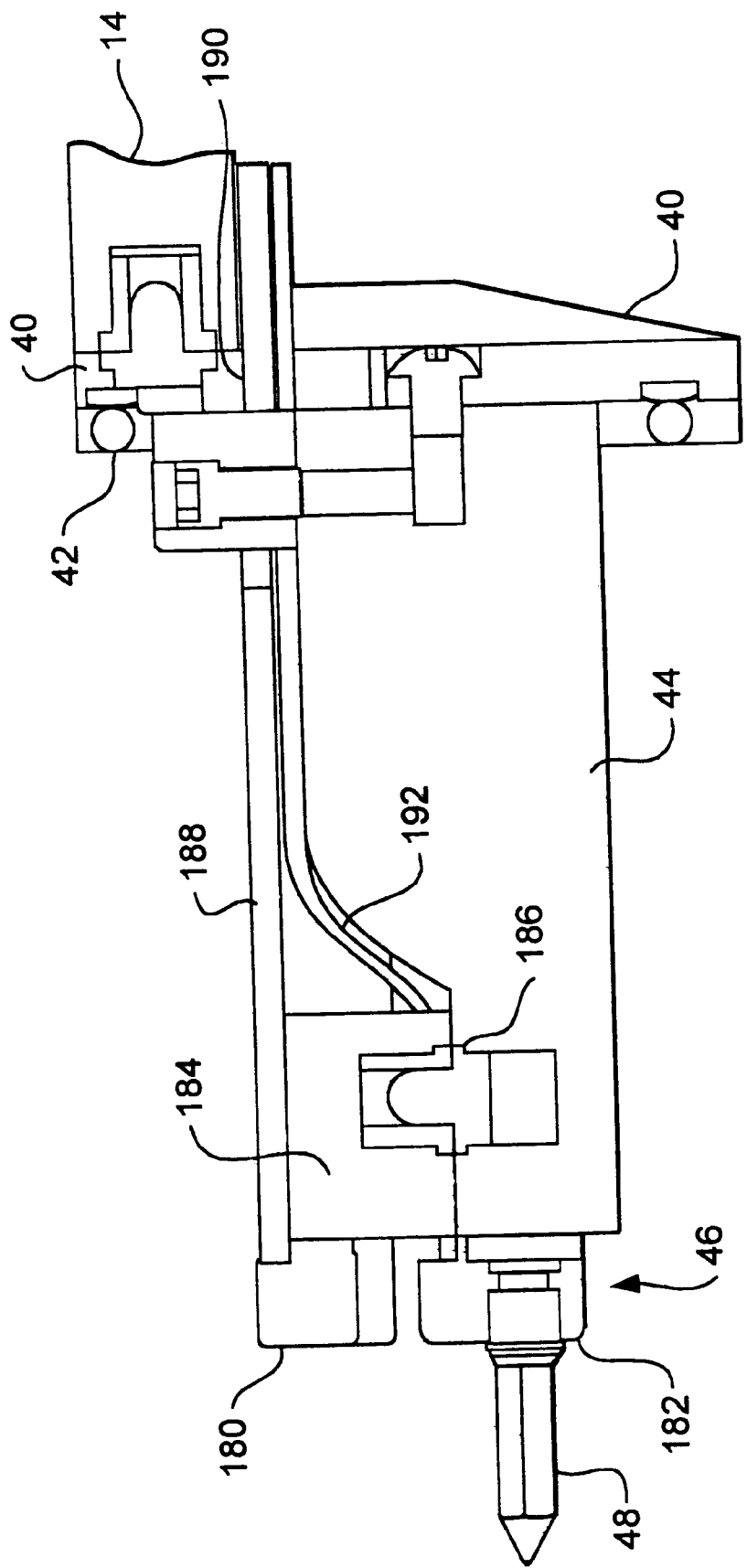
FIG. 13 is a cross-sectional view of the connector end of the probe plate of the cartridge of FIG. 1.

As mentioned before with reference to FIGS. 1 and 2, the probe card 50 is electrically connected to the electrical connectors 46 by means of two printed circuit boards. FIGS. 13 and 14 show the configuration of the printed circuit boards and how they are connected to the connectors 46 and the probe card 50.

FIG. 13 is a partial longitudinal cross-sectional view through the probe plate 14, showing the connector block 44, the connectors 46, the flange 40 and the seal 42. As can be seen from the FIG. 13, the connectors 46 include upper connectors 180 and lower connectors 182. The connectors 180, 182 are described in more detail in the concurrently filed, copending, commonly owned patent application entitled: "Wafer Level Burn-in and Electrical Test System and Method" (Attorney Docket Number AEHR-007/00US,) the disclosure of which is incorporated herein by reference.

The upper connectors 180 are mounted to the connector block 44 by means of a spacer block 184 and an alignment pin 186. The alignment pin 186 serves to align the upper connectors 180 with the lower connectors 182. The single alignment pin 186 is located centrally along the spacer block 184 in a direction transverse to the plane of FIG. 13, to accommodate thermal mismatch between the connector block 44 and the spacer block 184. Additional fasteners (not shown) are provided to hold the connector block 44 and the spacer block 184 together. These additional fasteners are spaced laterally apart from the alignment pin 186, and preferably allow for some movement between the spacer block 184 and the connector block resulting from temperature fluctuations. An example of an additional fastener that can be used is a small nut and bolt combination that has spring or wave washers at each end to engage the surfaces of the components to be fastened The spring or wave washers provide a clamping force while permitting some movement during relative motion resulting from thermal mismatches between the connector block 44 and the spacer block 184.

Each of the connectors 180 is mechanically and electrically connected to a rigid printed circuit board 188 that passes through a slot 190 formed in the flange 40 to the underside of the probe plate 14. Each of the connectors 182 is mounted to the connector block 44, and is mechanically and electrically coupled to a bendable printed circuit board 192. The bendable printed circuit board 192 passes through a slot (not shown) defined between the spacer block 186 and the connector block 44, and then passes - together with the rigid printed circuit board 188 - through the slot 190 to the underside of the probe plate 14. The rigid printed circuit board 188 is used to provide signals to and from the wafer under test, and the bendable printed circuit board is used to provide power to the wafer under test.

FIG. 14 is a schematic view of the underside of the probe plate 14. As can be seen from the figure, the bendable printed circuit boards 192, after passing through the flange 40, extend on either side of the probe card 50 in a generally L-shaped configuration. Located beneath each bendable printed circuit board 192 is the rigid printed circuit board 188 that extends in a similar manner around the probe card 50. The printed circuit boards are held against the probe plate 14 by means of a number of appropriately positioned screws. Electrical connection with the probe card 50 is made by a number of flexible interconnections 196. The interconnections 196 are sufficiently flexible to accommodate the movement of the probe card 50 in use.

The manner in which electrical connections are made in and with the cartridge of the invention is described in more detail in the concurrently filed, copending, commonly owned patent application entitled: "Wafer Level Burn-in and Electrical Test System and Method" (Attorney Docket Number AEHR-007/00US,) the disclosure of which is incorporated herein by reference.

Referring again to FIGS. 1 and 5, it can be seen that the chuck plate 12 has features specific to its tasks of locating a wafer and proving thermal management of the wafer during burn-in or test. Formed in the chuck plate 12 are a number of channels 22. When the cartridge 10 is located in use in a burn-in chamber, fluid is ducted through these channels 22 to remove heat dissipated by the wafer during burn-in. The channels 22 may be interrupted and staggered to further promote heat transfer, and may also be interrupted for access to various mechanical features necessary for the operation of the cartridge. As an alternative to forming the channels 22 in the chuck plate 12, the chuck plate 12 may be placed in contact with a separate plate in the burn-in chamber that has fluid channels formed therein.

The overall size and shape of the chuck plate 12 are determined from wafer size, as well as space considerations in the existing burn-in chamber configuration. In use, a wafer is placed on the upper surface 18 of the pedestal 16. The upper surface 18 is polished and lapped to a high degree of smoothness and flatness. It also includes vacuum grooves 19 for wafer restraint. This upper surface 18 receives plating or coating appropriate to the type of wafer under test. Protruding into the side of the pedestal 16 (radially) are a number of bores that receive cartridge heaters 21. These supply heat for some modes of operation, in order to achieve temperature control. A temperature sensor 23 is installed in the chuck near its top surface, to indirectly sense wafer temperature. In addition to these features, additional features specific to achieving temperature uniformity will be discussed below.

Temperature control of the wafer is accomplished as follows. The air from the burn-in chamber is ducted through the channels 22 of the chuck plate 12, while a powered wafer is pressed against the top surface by the probe card 50. The chamber is set for a temperature calculated using the characteristics of the chuck plate system and the wafer power dissipation. Fine control of temperature is from heat addition using the aforementioned cartridge heaters 21. A standard temperature controller is used to supply power to these heaters and, by receiving input from the temperature sensor 23, the temperature controller provides active, closed loop feedback control of the temperature of the pedestal 16.

Power to the heaters 21 and the signal from the temperature sensor 23 is also routed through the connectors 46. From the connectors 46, electrical connection is passed to contact pads on the chuck plate 12 via pogo pins mounted on the probe plate 14. From the contact pads, electrical connection is made with the heaters 21 and the temperature sensor via one or more flexible printed circuit boards that wrap around the pedestal 16.

It will be appreciated that the flow of heat in use, and the resulting temperature profiles in the chuck plate 12 may be less than ideal. In particular, it is desired to have a uniform and flat temperature profile across the upper surface 18 of the pedestal 16 of the chuck plate 12. The chuck plate 12 is aluminum. Heat conducts through metallic objects very well, but an object designed with mechanical constraints will (in all likelihood) have an unsuitable temperature distribution on the specified surface. Heat conducts (and convects) through air orders of magnitude more poorly than through metals. The embodiment of the chuck plate 12 described herein introduces precisely dimensioned regions of metal removal that change the effective conductivity of the metallic object in certain regions and/or directions, thus allowing temperature distribution to be decoupled from the chuck plate's exterior physical dimensions and thermal boundary conditions. The result is the ability to tailor the temperature distribution on a given surface to a broad range of functions and/or values.

As mentioned before, the wafer 74 rests on the upper surface 18 of the pedestal 16, as shown in FIG. 5. This surface experiences a heat flux, due to power dissipated by the wafer 74 that rests upon it. The configuration of the chuck plate 12 allows this surface to be more nearly isothermal, even though the outline dimensions thereof were chosen for mechanical reasons.

Thermal management of the chuck plate 12 is assisted by the use of one or more precisely dimensioned grooves parallel to the upper surface 18, extending around the circumference of the pedestal 16. As shown in FIG. 5, in the illustrated embodiment of the invention, one such groove is provided—a lower groove 198. It should be noted that an upper groove 200 is also formed in the chuck plate 12, but this groove is only used for the routing of electrical wiring to and from the cartridge heaters and temperature sensor, and does not contribute to the thermal management of the chuck plate. Heat flowing into the outer regions of the upper surface 18 is forced to travel radially inward by the groove 198, thus raising the edge temperature (which would naturally be lower than the center). For a properly sized and shaped groove 198, it is possible to achieve a nearly constant-temperature top surface 18.

Figure 15:
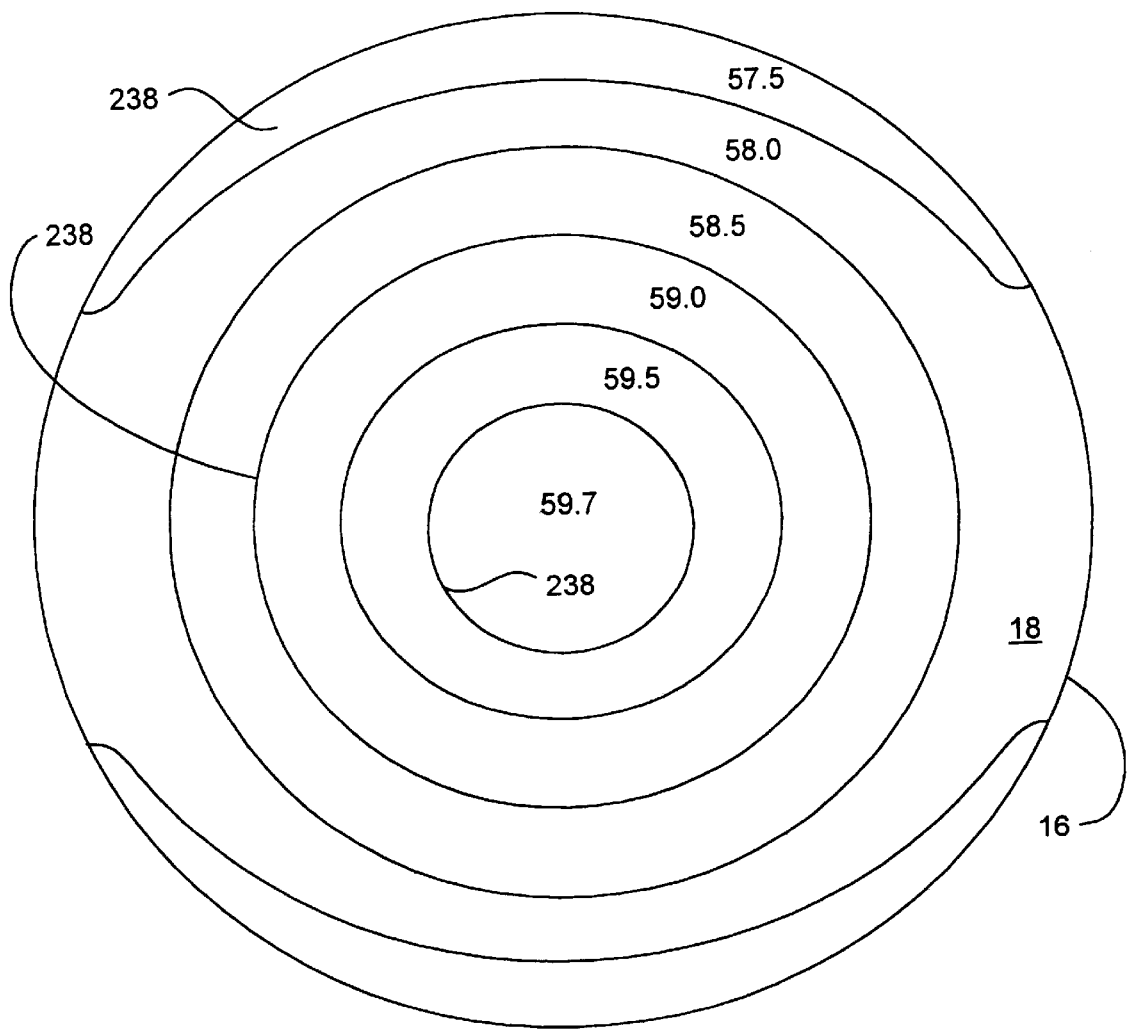
FIGS. 15 to 17 are plan views of isotherms on the upper surface of the chuck plate pedestal of cartridge of FIGS. 1–3.
Figure 16:
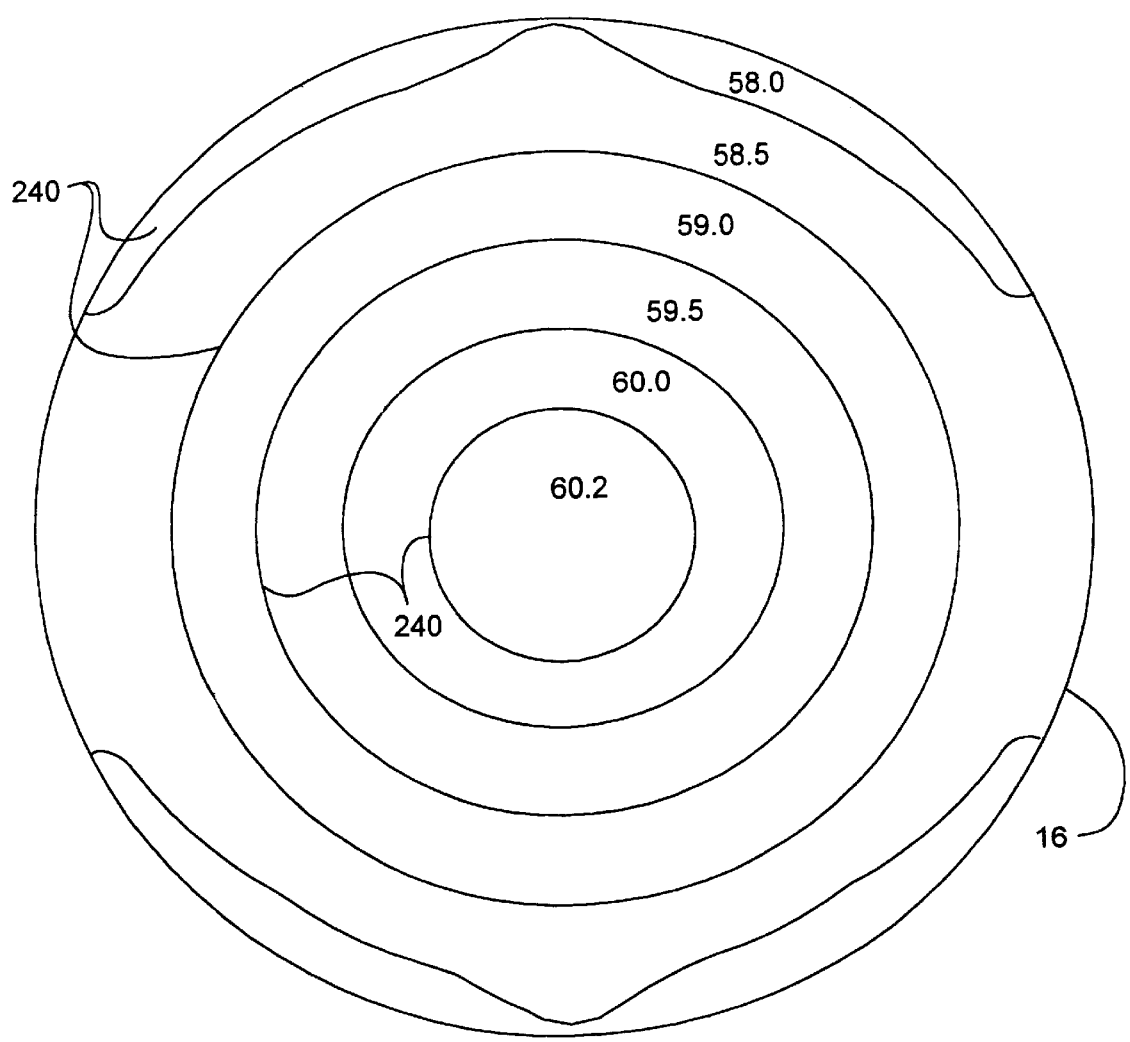
Figure 17:
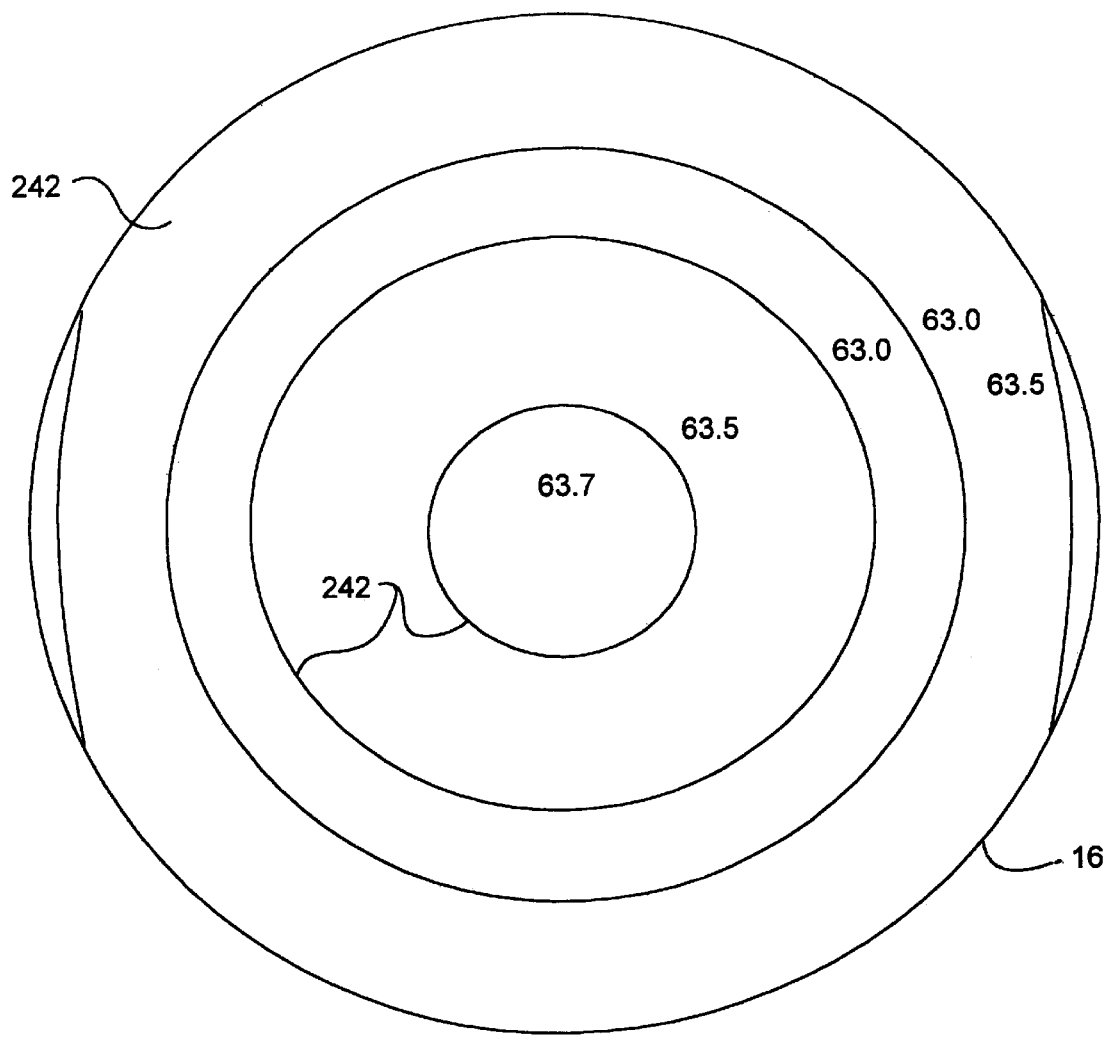

FIGS. 15–17, showing isothermal lines on the upper surface 18 of the pedestal 16, are useful for a more complete understanding of the operation of the thermal management features of the cartridge of the invention. FIG. 15 shows elliptical isothermal lines 238 formed in the upper surface 18 of the pedestal 16 in the absence of thermal management features. The temperature of each isothermal line 240 is shown in ° C. Elliptical isothermal lines typically occur as a result of an aspect ratio effect of the length of the chuck plate 12 (along the channels 22) to the width of the chuck plate (across the channels 22.) To turn the elliptical isothermal lines into circular isothermal lines, the depth of the groove 198 may be varied as it passes around the pedestal. Depending on the particular geometry of the chuck plate, the isothermal lines may not be elliptical. FIG. 16 shows such a case, where the isothermal lines are generally circular. In such a case it is not necessary to vary the depth of the groove 198. As shown in FIG. 17, when the appropriate groove 198 is provided, isothermal lines 242 have an essentially circular shape, and the upper surface becomes essentially isothermal, by raising the temperature adjacent to the outer edge of the pedestal 16.

In practice, burn-in of integrated circuits is usually carried out at 125–150° C. In one typical cycle, the integrated circuits are heated to 125–150° C. for 6 hours, followed by electrical test for one-half hour at 70° C. During burn-in of a typical dynamic random access memory (DRAM) integrated circuit wafer, electrical signals supplying about 500 watts of power are supplied to the wafer. If the groove 198 is not provided on the thermal chuck, there is approximately a 3 degree variation in the temperature over the surface of the pedestal 16. With the appropriate groove 198 on the chuck plate 12, there is less than a one degree variation in the temperature over the surface of the pedestal 16. At higher power levels, the temperature variation over the surface of the pedestal 16 is more significant. For example, some logic devices require application of electrical signals producing a power input in excess of 1 kilowatt to the wafer. Certain logic devices require power inputs as high as 1.5 kilowatt. At 1.5 kilowatt of power to the wafer, if the groove 198 is not provided on the chuck plate 12, there is approximately a 10° C. variation in the temperature over the surface of the pedestal 16 under these conditions. Such a temperature variation is a significant problem. With the groove 198 on the chuck plate 12, there is only a two-degree variation in the temperature over the surface of the pedestal 16 under these conditions.

In a specific example, for use with an 8 inch (200 mm) semiconductor wafer and length (along the channels 22) and width (across the channels 22) of the chuck plate of 18.72 inch (475 mm) and 16.5 inch (419 mm) respectively, with a pedestal height of 0.865 inch (22.0 mm,) the groove 198 is 0.062 inch (1.57 mm) high and 1.043 inch (26.49 mm) deep. For the illustrated cartridge, Applicants found that the isothermal lines were in fact not elliptical, and it was thus not necessary to vary the depth of the groove 198 as it passes around the pedestal 16.

Variation of the characteristics of the groove can however be a useful technique for tailoring the shape of the isothermal lines to the particular thermal characteristics of the cartridge system. For example, fluid in the channels 22 is going to rise in temperature as it flows along the channels 22, as a result of the heat that is being transferred to the fluid. As a result of this increase in temperature, the heat transfer to the fluid is going to be diminished along the length of the channels 22. This may result in an undesirable temperature gradient forming on the pedestals along the length of the channels 22. This can be compensated for by making the groove deeper at the entry side of the channels, or by providing additional grooves, or by tailoring the groove in other ways.

The particular characteristics of the groove 198 will vary depending on the particular characteristics and operation of the burn-in system. To determine the parameters of the groove for a particular burn-in system operated in a particular way, a computer-based heat transfer model of the chuck plate is generated, and the heat transfer characteristics of the chuck are modeled. Appropriate characteristics of the chuck plate in the heat transfer model will then be adjusted (e.g., the depth and variation in the depth of the groove) until the model demonstrates acceptable thermal characteristics. At that time, a prototype will be built and tested in the lab to verify the computer-based model. If the prototype demonstrates acceptable thermal characteristics, the geometry of the prototype will be adopted. If not, further adjustments will be made to the thermal model and the prototype, or just the prototype, until acceptable thermal characteristics are demonstrated by the prototype.

The chuck plate 12 is fabricated from a high thermal conductivity material, such as aluminum or other suitable metal or other material. It may either be integrally formed by machining a single piece of the material or assembled by fastening separate pieces of the material together to give the configuration shown. Preferably the chuck plate 12 is formed integrally, since the absence of interfaces between sub-components increases the efficiency of the heat transfer between the upper surface 18 of the chuck plate 12 and the fluid in the channels 22. In particular, this permits air to be used as a heat transfer fluid in the channels 22 at a higher wafer power dissipation level than would otherwise be possible, before requiring the use of a liquid coolant. The use of a gas coolant is more convenient than the use of a liquid coolant.

The loading of a wafer into the cartridge 10 will now be described. Firstly, the chuck plate 12 and the probe plate 14 are put into an alignment system. The alignment system will include appropriate pneumatic or vacuum connections for supplying pressurized air or suction to accomplish movement of the pistons 64 and 100, and to retain the wafer 74 on the pedestal 16.

Once the chuck plate 12 has been inserted in the alignment system, wafer 74 is placed on the upper surface of the pedestal. The positioning of the wafer on the pedestal can be done relatively crudely (e.g. within a tolerance of +/−0.005" (+/−0.127 mm) since the ability of the mechanical connecting devices 90 to accommodate misalignment between the probe plate 14 and the chuck plate 12 permits the fine alignment of the probe plate 50 to be done with reference directly to the wafer, without having to worry about precise alignment of the probe plate 14 with the chuck plate 12. The positioning of the wafer 74 on the pedestal 16 can be done using a known automatic wafer prealignment device that typically includes robot arms and a center and notch or flat finder. The prealignment device aligns the wafer 74 on the pedestal 16 in both x and y directions, and rotationally (theta) using a notch or flat in the wafer. Alternatively, alignment of the wafer on the chuck can be accomplished using a known manual alignment fixture.

Once the wafer 74 has been placed on the upper surface 18 of the pedestal 16, a vacuum is supplied to the grooves 19 underneath the wafer 74, thereby to retain the wafer securely on the pedestal 16. The air pressure in the space 72 behind the piston 64 is also reduced, retracting the piston 64 and the probe card 50 away from the wafer 74.

A vision capture system then captures images of the wafer and of the probe card, and calculations are performed by the alignment system to determine what movements are required to align the probe card 50 and the wafer 74. The precise alignment of the probe card 50 and the wafer 74 is then done. This can either be done by movement of either the probe plate 14 or the chuck plate 12, or by repositioning the wafer using wafer lift pins extending through holes formed in the chuck plate.

As an alternative, it is possible to capture an image of the wafer 74 while it is being held by a wafer handling robot, and then to position the wafer 74 onto the pedestal 16 in the correct alignment with the probe card 50. In such a case, the alignment and placing of the wafer 74 take place in one step. However, in this case the precise alignment of the wafer is still being done with reference to the probe card 50/probe plate 14, and not with reference to the chuck plate 12.

After the probe card 50 (and hence the probe plate 50) has been aligned with the wafer 74, the jaws 122, 124 of the mechanical connecting devices 90 are moved into their retracted positions by advancing the probe or key 130 between the jaws 122, 124 as described above with reference to FIG. 8. The space 118 is pressurized to advance the piston 100 (and hence the male connector 94) in the direction of the chuck plate 12. The chuck plate 12 and the probe plate 14 are then moved together by the alignment device. This movement is done, as far as is possible, in the Z-direction only, so that the alignment of the probe card 50 and the wafer is not disturbed. The probe plate 14 and the chuck plate 12 are moved together until the heads 96 of the male connectors 94 of the three mechanical connecting devices 90 are positioned between the jaws 122, 124 as shown in FIG. 8B.

The probe or key 130 is then withdrawn from between the jaws 122, 124, thereby to permit the jaws 122, 124 to return to their engaging positions. The space 118 behind the piston 100 is then depressurized and the male connector 94 is retracted under the biasing effect of the springs 110. As the male connector 94 retracts, it engages the jaws 122, 124, thereby to draw and lock the chuck plate 12 and the probe plate 14 firmly together, with the central raised portion 154 of the stop 140 abutting the raised portion 156 of the cover plate 116.

After actuation of the mechanical connecting devices 90, the piston 64 may be advanced to press the probe card 50 against the wafer 74. Alternatively, the piston 64 may be advanced or retracted (or, more correctly, the pressure differential across the piston 64 is varied) to adjust the initial probe actuation force. Actuation of the piston 64 is done by creating a pressure differential in the cartridge 10, which can be done in one of two ways.

Firstly, the pressure in the space 72 can be steadily increased, thereby to advance the probe card 50 against the wafer 74. The maximum pressure in the space 74 is selected to provide the desired probe actuation force. The desired probe actuation force is wafer and probe card specific, but is typically approximately 500 pounds (2.2 kS) for an 8 inch (200 mm) wafer.

Secondly, the air pressure in the space 74 can be normalized to ambient pressure before or at the same time as the air pressure in the vicinity of the wafer is reduced. In such a case, a seal is provided in the groove 76 as described above. By reducing the pressure in the vicinity of the wafer 74, the piston 64 and probe card 50 are sucked down onto the wafer. Again, the amount of pressure reduction in the vicinity of the wafer (or more correctly, the pressure differential across the piston 64) is selected to provide the desired probe actuation forces.

While reducing pressure in the vicinity of the wafer 74 and increasing the pressure in the space 72 are acceptable alternatives for actuating the piston 64, Applicants believe that reducing the pressure in the vicinity of the wafer is the best mode of providing the probe actuation force, since the reaction forces generated thereby are self-contained at the wafer, probe card 50 and pedestal 16. This is in contrast to raising the pressure in space 72, which tends to push the probe plate 14 and chuck plate 12 apart when the probe card 50 bears against the wafer 74. This would cause some deflection of the probe and chuck plates.

There are a number of more specific methods of locking the chuck plate 12 and the probe plate 14 together and providing a probe actuation force, as will be discussed below. For purposes of conciseness, the stop 140 (with its central raised portion 154) and the raised portion 156 of the cover plate 116 will now be referred to collectively as "the stops," having a combined "stop height."

Method 1

The alignment device moves the chuck plate 12 and the probe plate 14 together until the probe card 50 comes into contact with the wafer and the stops are bottomed, with the stop height having been adjusted such that, when the stops are bottomed, the probe card 50 is pressed against the wafer 74 with the full probe actuation force. The alignment device thus provides the entire probe actuation force. This "mechanical only" form of actuation is not preferred since the alignment device is required to provide the probe actuation force, which may be in the range of 100 to 1000 pounds, and is typically about 500 pounds.

Method 2

The alignment device moves the chuck plate 12 and the probe plate 14 together until the probe card 50 comes into contact with the wafer, and the movement of the alignment device is stopped before the stops are bottomed. Again, the stop height has been adjusted such that, when the stops are bottomed, the probe card 50 is pressed against the wafer 74 with the full probe actuation force. The mechanical connecting devices 90 are then actuated to complete the actuation of the cartridge and to provide the entire probe actuation force. In this method, the alignment device is only required to provide a percentage of the probe actuation force. (for example, but not limited to, 1 to 10%,) to lock in the x and y relationships between the probe card 50 and the wafer during final movement of the chuck plate 12 and probe plate 14. Locking in these relationships reduces the chance of misalignment during final actuation.

Methods 1 and 2 are "mechanical only" methods of actuation that have the advantages that a) the probe card 50 is not required to be movably mounted to the probe plate and b) pneumatics/vacuum is not required to provide the probe actuation force. These "mechanical only" actuation methods are thus cheaper to implement than some of the other methods.

Method 3

The alignment device moves the chuck plate 12 and the probe plate 14 together until the probe card 50 comes into contact with the wafer, and the movement of the alignment device is stopped before the stops are bottomed. The mechanical connecting devices 90 are then actuated to bottom the stops. The area 72 behind the piston 64 is then pressurized to provide the probe actuation force. In this method, the alignment device is again only required to provide a percentage of the probe actuation force (for example, but not limited to, 1 to 10%,) to lock in the x and y relationships between the probe card 50 and the wafer during final z-movement of the chuck plate 12 and probe plate 14.

Method 4

The alignment device moves the chuck plate 12 and the probe plate 14 together until the probe card 50 comes into contact with the wafer and the stops are bottomed. The mechanical connecting devices 90 are then actuated to lock the chuck plate 12 and the probe plate 14 together. The area 72 behind the piston 64 is then pressurized to provide the probe actuation force. In this method, the alignment device is again only required to provide a percentage of the probe actuation force (for example, but not limited to, 1 to 10%,) to lock in the x and y relationships between the probe card 50 and the wafer during final z-movement of the chuck plate 12 and probe plate 14.

Method 5

The alignment device moves the chuck plate 12 and the probe plate 14 together until the probe card 50 comes into contact with the wafer, and the movement of the alignment device is stopped before the stops are bottomed. The mechanical connecting devices 90 are then actuated to bottom the stops. The pressure in the vicinity of the wafer 74 is reduced to provide the probe actuation force. In this method, the alignment device is again only required to provide a percentage of the probe actuation force (for example, but not limited to, 1 to 10%,) to lock in the x and y relationships between the probe card 50 and the wafer during final z-movement of the chuck plate 12 and probe plate 14.

Method 6

The alignment device moves the chuck plate 12 and the probe plate 14 together until the probe card 50 comes into contact with the wafer and the stops are bottomed. The mechanical connecting devices 90 are then actuated to lock the chuck plate 12 and the probe plate 14 together. The pressure in the vicinity of the wafer 74 is reduced to provide the probe actuation force. In this method, the alignment device is again only required to provide a percentage of the probe actuation force (for example, but not limited to, 1 to 10%,) to lock in the x and y relationships between the probe card 50 and the wafer during final z-movement of the chuck plate 12 and probe plate 14.

Applicants believe that methods 5 and 6 are the two, equally good, best-mode methods of locking the chuck plate 12 and the probe plate 14 together and providing a probe actuation force.

Method 7

The alignment device moves the chuck plate 12 and the probe plate 14 together until the stops are bottomed but without the probe card 50 coming into contact with the wafer. The mechanical connecting devices 90 are then actuated to lock the chuck plate 12 and the probe plate 14 together. The area 72 behind the piston 64 is then pressurized to provide the probe actuation force.

Method 8

The alignment device moves the chuck plate 12 and the probe plate 14 together until the stops are bottomed but without the probe card 50 coming into contact with the wafer. The mechanical connecting devices 90 are then actuated to lock the chuck plate 12 and the probe plate 14 together. The pressure in the vicinity of the wafer 74 is reduced to advance the probe card 50 and to provide the probe actuation force.

When the mechanical connecting devices 90 draw the chuck plate 12 and the probe plate 14 together to bottom the stops, appropriate control elements are used to slow the rate of the clamping. The control elements may for example be orifices that are added to the pneumatic lines to slow the rate of venting.

Also, for the methods utilizing a pressure differential to provide or maintain the probe actuation force, the cartridge 10 includes an automatic valve in the appropriate nipple 31 for maintaining the pressure differential when disconnected, thereby to maintain the probe actuation force.

After the execution of one of the above methods, the cartridge is a self-contained and aligned probing and clamping device. The alignment of the wafer and the probe card is maintained as a result of the pressure differential across the piston 64 and/or the clamping force of the mechanical connecting devices 90. Accordingly, no further external alignment devices are required, and no external mechanism is required for providing a clamping force or a probe actuation force during burn-in. However, upon insertion into a burn-in chamber, connection is typically reestablished with the nipples 31 to provide maintenance of the pressure differential across the piston 64. This is done to compensate for any leaks that might occur, and also to provide a means for controlling the probe actuation force, since the pressure differentials in the cartridge 10 will vary as the temperature of the cartridge 10 varies.

To provide the burn-in and/or test of the wafer, the cartridge 10 is placed in a burn-in chamber. The burn-in chamber typically includes a number of horizontally spaced positions for receiving cartridges in a spaced-apart stacked relationship. This permits burn-in of a number of wafers to be done simultaneously.

To provide the burn-in and test of the wafer, it is necessary to engage the connectors 46, 180, 182 with corresponding connectors in the burn-in chamber. To accomplish this engagement, a substantial insertion force may be required. The cartridge 10 and the burn-in chamber include an insertion mechanism, whereby engagement of the respective electrical connectors may be accomplished automatically, as discussed below with reference to FIGS. 20 to 24.

Figure 20:
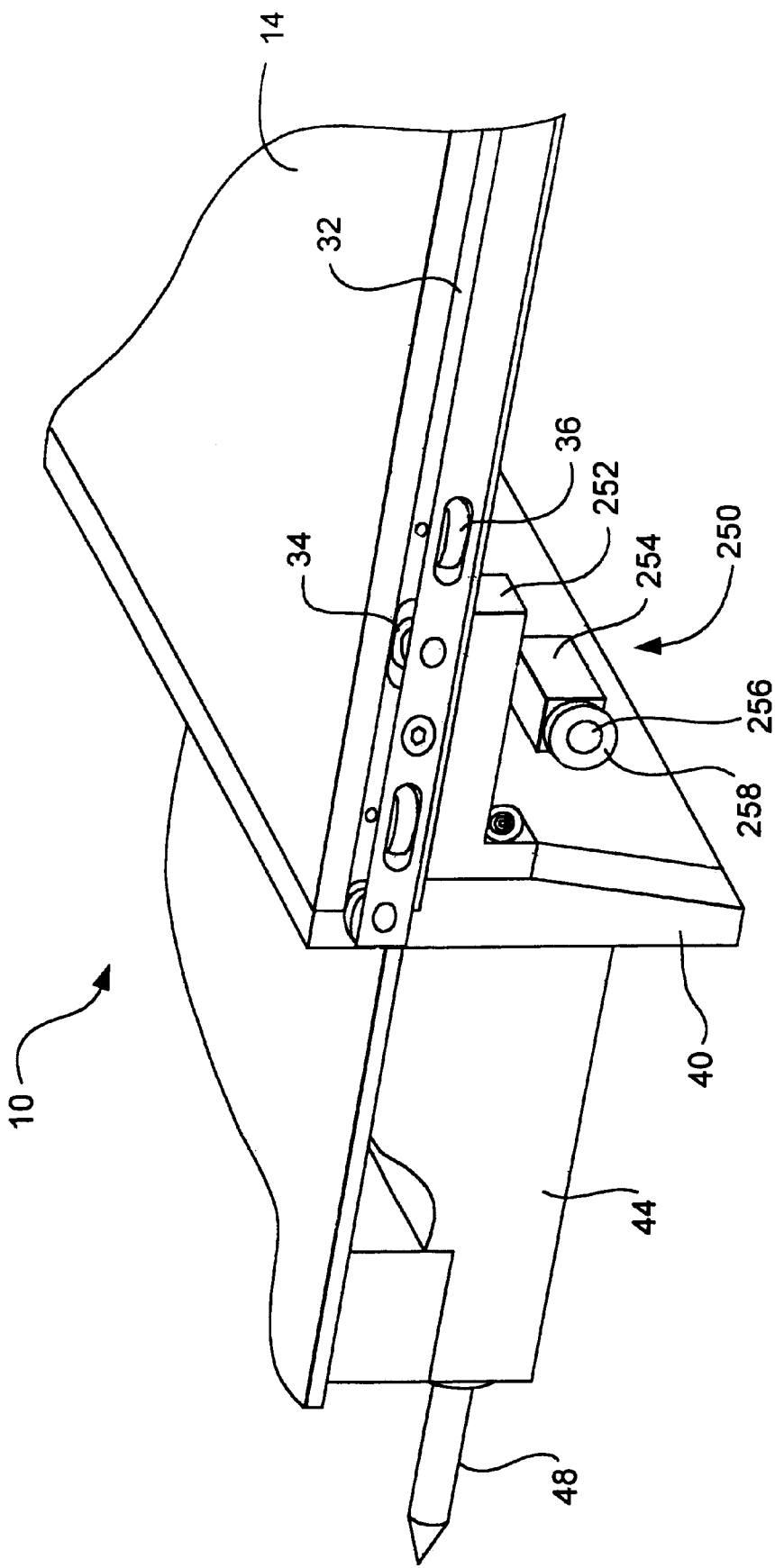
FIG. 20 is a perspective view of one corner of the cartridge of FIG. 1.

The insertion mechanism includes a cam follower arrangement 250, one of which is provided on each side of the cartridge 10 as can be seen in FIG. 20. The cam follower arrangement includes a mounting block 252 mounted to the probe plate 14 adjacent to the flange 40. The mounting block 252 includes a transversely extending portion 254 and a short shaft 256. Press-fitted to the shaft 256 is a ball-bearing 258.

Figure 21:
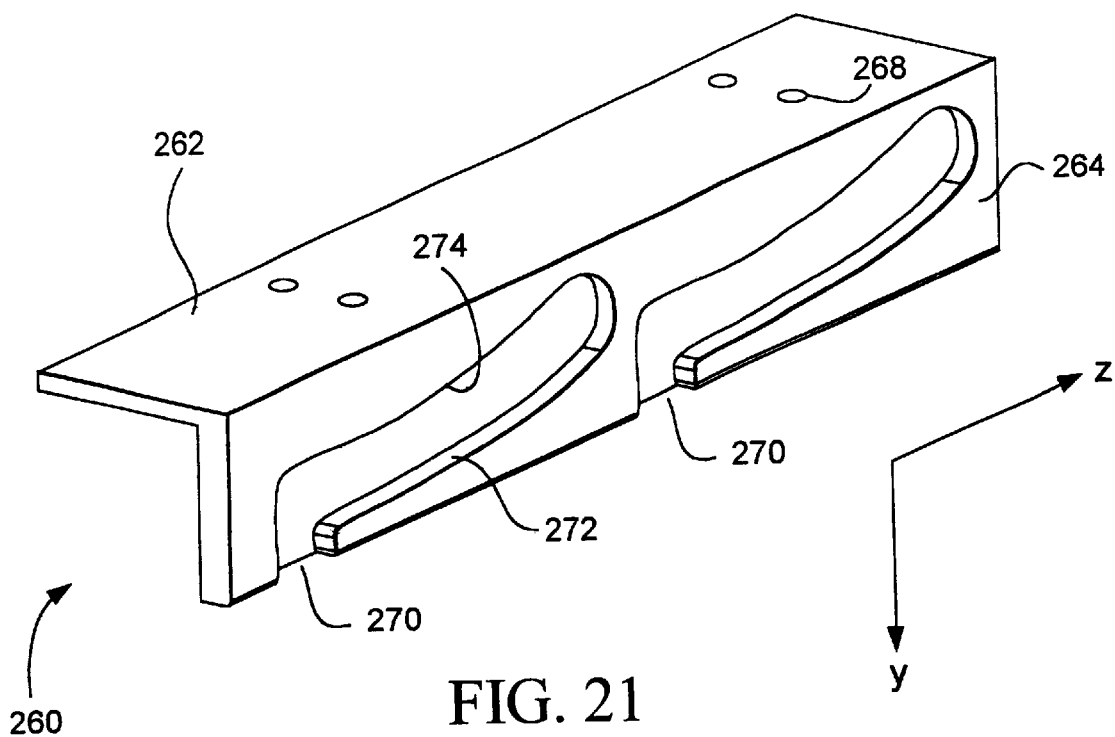
FIGS. 21 and 22 are perspective views of a cam plate for use with the cartridge of FIGS. 1 and 20.
Figure 22:
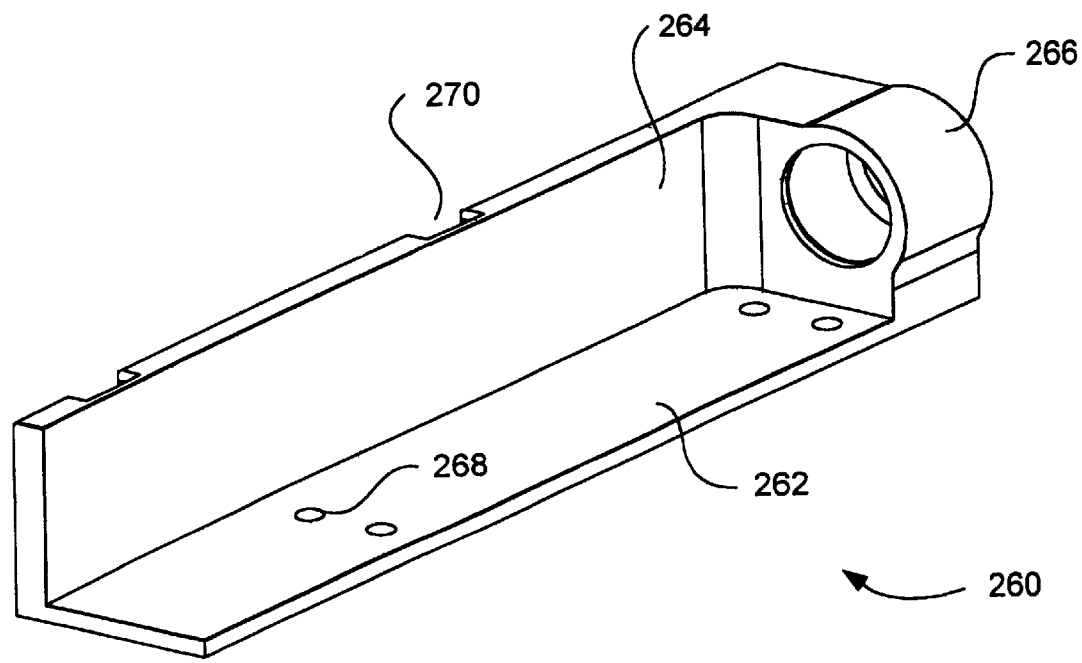

The outer surface of the ball-bearing 258 is engaged in use by a cam plate 260 that is shown in more detail in FIGS. 21 and 22.

The cam plate 260 includes two walls 262 and 264 that are located at right angles to one another. Between the walls 262, 264 at one end of the cam plate 258 is a collar 266 whereby the cam plate is connected to a pneumatic cylinder as will be discussed in more detail below. Formed in the wall 262 are four holes 268 by means of which the cam plate may be mounted to a linear slide such as a cross roller bearing slide or a linear ball slide, also as discussed in more detail below. Formed in the outer surface of the wall 264 is at least one groove 270 that is sized to receive the ball bearing 258 of a cartridge 10.

In the illustrated embodiment there are two grooves 270, but of course it will be appreciated that the number of grooves 270 in the cam plate 260 may be varied to accommodate a different number of cartridges 10. Applicants believe that a single cam plate 260 can comfortably be provided with seven grooves, to enable seven cartridges to be engaged simultaneously with their corresponding electrical connectors in a burn-in chamber.

Each groove 270 is defined by two cam surfaces 272 and 274. The cam surface 272 is used to advance the cartridge 10 into the burn-in chamber, thereby to engage the electrical connectors of the cartridge with the corresponding connectors in the burn-in chamber. The cam surface 274 is used to retract the cartridge 10 to disengage the connectors. For a maximum movement of 2.5 inch (64 mm) of the cam plate 260 in the Z-direction, a ball bearing located in the groove (and constrained to move in the Y-direction) will move approximately 0.35 inch (9 mm,) to provide a mechanical advantage of approximately 7. That is, a force applied to the cam plate 264 in the Z-direction will result in a force seven times as large being applied to the ball bearing in the y direction.

Figure 23:
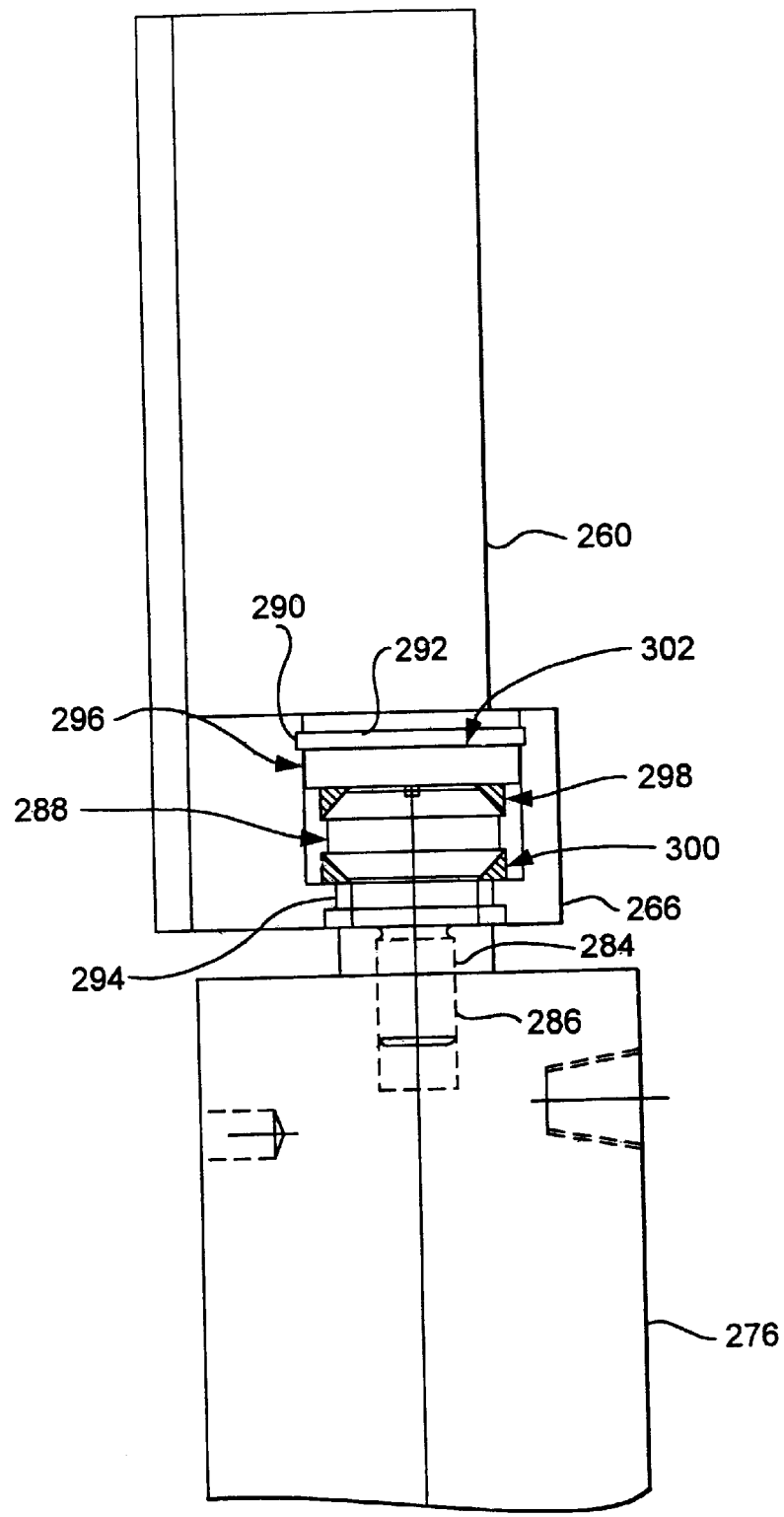
FIG. 23 is a cross-sectional view illustrating the coupling between the cam plate of FIGS. 21 and 22 and a pneumatic cylinder.
Figure 24:
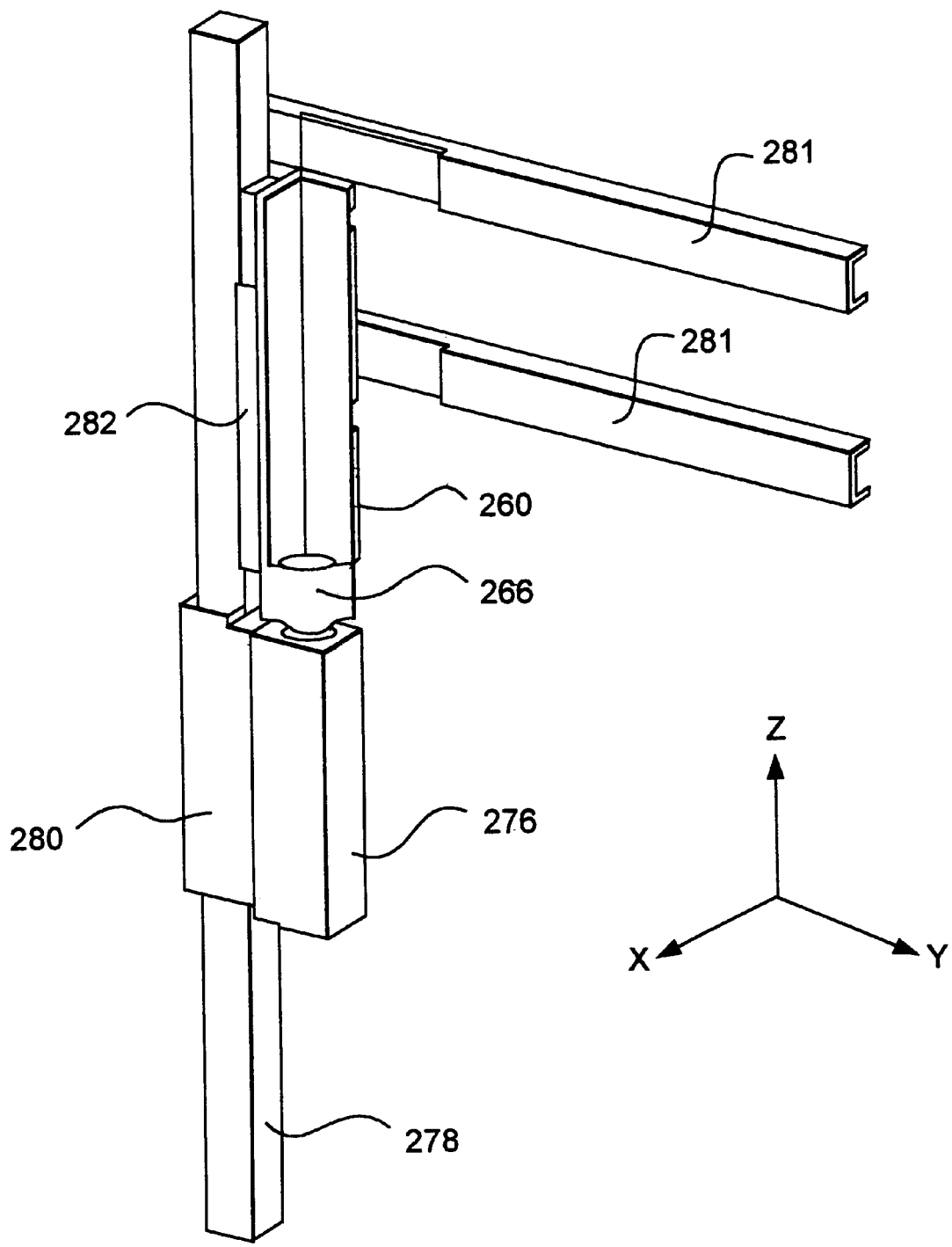
FIG. 24 is a perspective view of a mechanism for engaging and disengaging the electrical connectors of the cartridge of FIG. 1 with corresponding electrical connectors in a burn-in chamber.

Referring now to FIGS. 23 and 24, in use the cam plate 260 is connected in the burn-in chamber to a pneumatic cylinder 276 via the collar 266. The pneumatic cylinder 276 is in turn mounted to a vertical bar 278 in the burn-in chamber via a connecting block 280. The pneumatic cylinder has a stroke of approximately 2.5" and is used to move the cam plate in the Z-direction. The cam plate 260 is slidably mounted to the bar 278 by means of a linear slide 282 that transfers lateral forces experienced by the cam plate 260 to the bar 278 while permitting the cam plate to slide along the bar 278 in the Z-direction. Mounted to the bar 278 is at least one channel 281 for receiving the rail 32 of a cartridge 10.

The connection between the collar 266 of the cam plate 260 and the pneumatic cylinder 276 is shown in more detail in FIG. 23. Screwed into the piston of the pneumatic cylinder 276 is a stud 284. The stud 284 has screw threads 286 defined in one end thereof for threaded engagement with a bore formed in the piston of the pneumatic cylinder 276. At the other end, the stud 284 has a beveled head 288. The collar 266 includes a groove 290 for receiving a retaining ring 292. The collar 266 also includes an internal ring 294. In assembled form, the collar also receives a washer 296, two opposed beveled washers 298 and 300, and a spring washer 302. In use, when the piston of the pneumatic cylinder is advanced, the head 288 of the stud 284 bears against the beveled washer 298. The beveled washer 298 in turn bears against the washer 296, which bears against the spring washer 302, which bears against the retaining ring 292, which in turn transfers the actuating force of the pneumatic cylinder to the collar 266. When the piston of the pneumatic cylinder is retracted, the beveled head 288 bears against the beveled washer 300, which transfers the actuating force of the pneumatic cylinder 276 to the collar 266. The components illustrated in FIG. 23 fit reasonably snugly together, with the spring washer providing sufficient play to allow some nutational misalignment between the stud 284 and the collar 266, and the clearances between the outer surfaces of the washers 298, 300 providing sufficient play to allow some sideways misalignment of the stud 286 and the collar 266.

It will be appreciated that FIG. 24 shows only one half of the structures and components required to support and engage the two sides of a cartridge 10 in the burn-in chamber. A second set of identical, but mirror-image components is provided in the burn in chamber for receiving and engaging the other side of a cartridge 10.

In use, the cartridge 10 is slid horizontally, electrical connector end first, into the burn-in chamber, with the rails 32 fitting into the channels 281 in the burn-in chamber. As the cartridge approaches its fully inserted position, the alignment pins 48 enter corresponding alignment holes in the burn-in chamber. This serves to align the connectors 46 with complementary electrical connectors provided in the burn-in chamber. At this time, the ball bearings 258 are received in the open ends of the grooves of two opposed cam plates 260. The pistons of the pneumatic cylinders 276 are then advanced to provide the necessary forces (via the cam plates 260) for engaging the electrical connectors 46 on the cartridge with corresponding electrical connectors in the burn-in chamber. As mentioned previously, when engaged, the connectors 46 protrude into a cooler section of the burn-in chamber through an aperture formed in a wall in the burn-in chamber. When the cartridge is fully inserted into the burn-in chamber, the flange 40 and seal 42 serve to close the aperture and isolate the cooler section (and hence the connectors 46) from the hotter section of the burn-in chamber. Further, when the cartridge is fully inserted in the burn-in chamber, the channels 22 of the cartridge 10 are aligned with air vents for providing cooling air, and external power and test signals can be applied to the wafer 74 via the connectors 46. Burn-in and test of the wafer then progresses as described in more detail in the concurrently filed, copending, commonly owned patent application entitled: "Wafer Level Burn-in and Electrical Test System and Method" (Attorney Docket Number AEHR-007/00US,) the disclosure of which is incorporated herein by reference.

Generally speaking, the temperature in the burn-in chamber is raised to the required temperature, and power and timing, logic or other test signals are applied to the wafer for the required burn-in duration. It will be noted however, that the cartridge may be used for other wafer-level testing or burn-in methods. At the end of the burn-in and/or test procedure, the pistons of the pneumatic cylinders 276 are withdrawn, to disengage the electrical connectors 46 from the electrical connectors in the burn-in chamber. The cartridge 10 is then removed from the burn-in chamber and placed in the alignment device (or a custom fixture), and the wafer is then removed by retracting the piston 64 (and hence the probe card 50) from the wafer, then disengaging the mechanical connecting devices 90 and then lifting the probe plate 14 off the chuck plate 12 using the alignment device. A wafer-handling robot then removes the wafer. In the cases where the probe card 50 is not movable, it may be necessary for the alignment device or fixture to apply a compressive force to the cartridge 10 before the mechanical connecting devices are disengaged.

All publications and patent applications mentioned in this specification are herein incorporated by reference to the same extent as if each individual publication or patent application was specifically and individually indicated to be incorporated by reference. The invention now being fully described, it will be apparent to one of ordinary skill in the art that many changes and modifications can be made thereto without departing from the spirit or scope of the appended claims.

What is claimed is:

1. A kinematic coupling comprising:
   a male connector coupled to a first plate, of an electrical apparatus the male connector including an undercut surface; and
   first and second opposed jaws coupled to a second plate, each of the jaws including a protruding lip and being pivotally mounted to the second plate by a pivot pin and movable from a retracted position in which the male connector can be inserted between the jaws and an engaging position in which the jaws prevent withdrawal of the male connector from between the jaws by engaging the undercut surface of the male connector,
   wherein
      i) the jaws are biased towards their respective engaging positions by a force that is applied to the jaws at a position located on the same side of the pivot pin as the protruding lip and
      ii) the jaws are moved by linearly translating a probe along a direction that is substantially perpendicular to translational movement by said jaws.

2. A kinematic coupling according to claim 1, wherein said force is applied to the first and second opposed jaws at a position located between said pivot pin and said protruding lip.

3. A kinematic coupling according to claim 2, wherein the probe is a key and the first and second jaws each include an inclined surface that can be acted upon by linearly translating the key away from said protruding lip to move the first and second jaws into their respective retracted positions.

4. A kinematic coupling according to claim 1, wherein the male connector is movably coupled to the first plate, and
   wherein, when the male connector is inserted between the first and second jaws and the first and second jaws are both in their engaging positions, the male connector is movable relative to the first plate between an extended position in which the engaging surface of the male connector is not in contact with the first and second jaws and a retracted position in which the engaging surface of the male connector is in contact with the first and second jaws.

5. A kinematic coupling according to claim 4, wherein the male connector is biased toward its retracted position.

6. A kinematic coupling according to claim 4 wherein the male connector is moved into its extended position in use by means of a pressure differential.

7. A kinematic coupling according to claim 3 wherein the first and second jaws make line contact with the engaging surface of the male connector in use.

8. A kinematic coupling according to claim 3 wherein the first and second jaws make point contact with the engaging surface of the male connector in use.

9. A kinematic coupling according to claim 3 further comprising
a first stop adjacent to the male connector, and
a second stop adjacent to the jaws,
wherein movement of the male connector towards its retracted position in use engages the jaws and pulls the first and second stops together.

10. A kinematic coupling according to claim 9 wherein at least one of the stops is adjustable in the direction of movement of the male connector.

11. A kinematic coupling comprising:
a male connector coupled to a first plate, of an electrical apparatus the male connector including an undercut surface; and
at least one jaw coupled to a second plate, the at least one jaw including a protruding lip and being pivotally mounted to the second plate by a pivot pin and movable from a retracted position in which the male connector can be received by the at least one jaw and an engaging position in which the at least one jaw prevents withdrawal of the male connector from the at least one jaw by engaging the undercut surface of the male connector,
wherein
i) the at least one jaw is biased toward its respective engaging position by a force that is applied to the at least one jaw at a position located on the same side of the pivot pin as the protruding lip and
ii) the at least one jaw is moved by linearly translating a probe along a direction that is substantially perpendicular to translational movement by said jaws.

12. A kinematic coupling according to claim 11, wherein the male connector is movably coupled to the first plate, and wherein in use
the male connector is movable relative to the substrate between an extended position in which the engaging surface of the connector is not in contact with the at lease one jaw and a retracted position in which the engaging surface of the male connector is in contact with the at least one jaw.

13. A kinematic coupling according to claim 12, wherein said force is applied to the first and second opposed jaws at a position located between said pivot pin and said protruding lip.

14. A kinematic coupling according to claim 12 wherein the male connector is moved into its extended position in use by means of a pressure differential.

15. A kinematic coupling according to claim 12 wherein the male connector makes line contact with the at least one jaw.

16. A kinematic coupling according to claim 12 wherein the male connector makes point contact with at least one jaw.

17. A kinematic coupling according to claim 12 further comprising a first stop adjacent to the male connector; and
a second stop adjacent to the at least one jaw,
wherein movement of the male connector towards its retracted position in use engages the at least one jaw and pulls the first and second stops together.

18. A kinematic coupling according to claim 17 wherein at least one of the stops is adjustable in the direction of movement of the male connector.

19. A kinematic coupling according to claim 11, wherein the probe includes a spherical head and the at least one jaw includes an inclined surface that can be acted upon by linearly translating the spherical head away from said protruding lip to move the at least one jaw into its retracted position.

20. A cartridge comprising:
a first plate;
a probe card mounted to the first plate;
a second plate;
a mechanism coupled to the second plate to hold a semiconductor wafer opposite to and available for electrical communication with the probe card;
a kinematic coupling included,
a male connector coupled to one of the first or second plates including an undercut surface; and
first and second opposed jaws coupled to the other of said first and second plates, each of the jaws including a protruding lip and being pivotally mounted to a chuck plate by a pivot pin and movable from a retracted position in which the male connector can be inserted between the jaws and an engaging position in which the jaws prevent withdrawl of the male connector from between the jaws by engaging the undercut surface of the male connector,
wherein the jaws are biased towards their respective engaging positions by a mechanism that provides an inwardly directed force that is applied to the jaws at a position located on the same side of the pivot pin as the protruding lip.

21. The cartridge of claim 20, wherein the jaws are moved by lineraly translating a probe along a direction that is substantially perpendicular to tranlational movement by said jaws.

22. A cartridge comprising:
a first plate;
a probe card mounted to the first plate;
a second plate;
a mechanism coupled to the second plate to hold a semiconductor wafer opposite to and available for electrical communication with the probe card;
kinematic coupling including,
a male connector coupled to one of the first or second plates including an undercut surface; and
first and second opposed jaws coupled to the other of said first and second plates, each of the jaws movable from the retracted position in which the male connector can be inserted between the jaws and an engaging position in which the jaws prevent withdrawl of the male connector from between the jaws by engaging the male connector;
wherein the kinematic coupling is configured to be engaged over a range of relative lateral movement of the first and second plates in a first state and not engaged in the range of relative lateral movement of the first and second plates in a second state.

23. The cartridge of claim 22, wherein the jaws have protruding lips, the male connector has an undercut surface and a neck adjacent to the undercut surface and male connector has a neck adjacent to the undercut surface and the kinematic coupling has a clearance between the protruding lips of the jaws and the neck, the clearance permitting the kinetic coupling to be engaged over the range of relative lateral movement of the first and second plates in the first state.

24. The cartridge of claim 22, wherein the range of relative lateral movement is less than +/−1.27 millimeters.

25. The cartridge of claim 22 wherein the mechanism coupled to the second plate to hold a semiconductor wafer comprises a pedestal including vacuum grooves.

26. The cartridge of claim 22, wherein the kinematic coupling includes a mechanism to provide a retracting force on the male connector perpendicular to the lateral movement in the second state, preventing the lateral movement in the second state.

27. The cartridge of claim 26, wherein the retracting force is between 735 and 1020 N.

28. The cartridge of claim 26, wherein the mechanism to provide the retracting force comprises a spring.

29. The cartridge of claim 28, wherein the male connector is moved into its extended position in use by means of a pressure differential.

* * * * *